US010615319B2

(12) United States Patent
Isono et al.

(10) Patent No.: US 10,615,319 B2
(45) Date of Patent: Apr. 7, 2020

(54) LIGHT EMITTING DEVICE

(71) Applicant: NICHIA CORPORATION, Anan-shi, Tokushima (JP)

(72) Inventors: Mitsuhiro Isono, Itano-gun (JP); Kensuke Maehara, Komatsushima (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 16/164,677

(22) Filed: Oct. 18, 2018

(65) Prior Publication Data
US 2019/0123247 A1 Apr. 25, 2019

(30) Foreign Application Priority Data

Oct. 20, 2017 (JP) .................. 2017-203185
Mar. 2, 2018 (JP) .................. 2018-037400

(51) Int. Cl.
H01L 33/52 (2010.01)
H01L 33/50 (2010.01)
H01L 33/60 (2010.01)
H01L 33/62 (2010.01)
H01L 33/54 (2010.01)
H01L 33/48 (2010.01)

(52) U.S. Cl.
CPC ............ H01L 33/52 (2013.01); H01L 33/486 (2013.01); H01L 33/50 (2013.01); H01L 33/54 (2013.01); H01L 33/60 (2013.01); H01L 33/62 (2013.01)

(58) Field of Classification Search
CPC ..... H01L 33/48; H01L 33/483; H01L 33/486; H01L 33/60
See application file for complete search history.

(56) References Cited

U.S. PATENT DOCUMENTS

2011/0220926 A1* 9/2011 Kim .................. H01L 33/60 257/91
2012/0326193 A1* 12/2012 Park .................. H01L 33/52 257/98
2013/0307003 A1* 11/2013 Park .................. H01L 33/46 257/98

(Continued)

FOREIGN PATENT DOCUMENTS

JP 2005-136378 A 5/2005
JP 2012-089547 A 5/2012

(Continued)

Primary Examiner — David C Spalla
(74) Attorney, Agent, or Firm — Foley & Lardner LLP

(57) ABSTRACT

A light emitting device includes: a light-emitting element; a resin package including a plurality of leads including first and second leads, a first resin portion, a second resin portion extending around an element mounting region, and a third resin portion, wherein the plurality of leads and the first resin portion define a recess having an inner side-wall surface; a light-reflective member being located between the inner side-wall surface and the second resin portion inside the recess; and an encapsulant located in a region of the recess that is surrounded by the light-reflective member, the encapsulant covering the second resin portion and the light-emitting element. The second resin portion has a depression in a surface thereof. A part of the encapsulant is located inside the depression of the second resin portion.

20 Claims, 19 Drawing Sheets

(56) References Cited

U.S. PATENT DOCUMENTS

| | | | |
|---|---|---|---|
| 2014/0085884 A1 | 3/2014 | Horio et al. | |
| 2014/0124812 A1* | 5/2014 | Kuramoto | H01L 24/97 257/98 |
| 2017/0186927 A1* | 6/2017 | Naka | H01L 33/60 |
| 2018/0163954 A1 | 6/2018 | Kawagoe et al. | |

FOREIGN PATENT DOCUMENTS

| | | |
|---|---|---|
| JP | 2013-062493 A | 4/2013 |
| JP | 2013-115116 A | 6/2013 |
| JP | 2013-131519 A | 7/2013 |
| JP | 2013-171969 A | 9/2013 |
| JP | 2014-067846 A | 4/2014 |
| JP | 2014-158011 A | 8/2014 |
| JP | 2017-120889 A | 7/2017 |
| WO | WO-2017/033890 A | 3/2017 |

* cited by examiner

LIGHT EMITTING DEVICE

CROSS-REFERENCE TO RELATED APPLICATION

This application claims priority to Japanese Patent Application No. 2017-203185, filed on Oct. 20, 2017, and Japanese Patent Application No. 2018-037400, filed on Mar. 2, 2018, the disclosures of which are hereby incorporated by reference in their entireties.

BACKGROUND

The present disclosure relates to a light emitting device.

Semiconductor light-emitting elements such as LEDs are widely used in various illuminations, backlights of liquid crystal display devices, and the like. For example, Japanese Patent Publication No. 2014-158011 discloses an LED device including a resin package in which a metal portion and a resin portion are provided. The resin package has a recess in which an LED element is placed. In Japanese Patent Publication No. 2014-158011, a reflective layer is provided on the inner wall of the recess in order to improve light extraction efficiency.

In FIG. 13, Japanese Patent Publication No. 2014-158011 discloses a structure in which a partition that surrounds the LED element is further formed inside the recess. In the technique described in Japanese Patent Publication No. 2014-158011, after the LED element is placed in the recess of the resin package, the partition and the reflective layer are sequentially formed. The partition surrounding the LED element prevents the composition that makes up the reflective layer from adhering to the lateral face of the LED element. After formation of the reflective layer, a composition containing a transparent resin and particles of phosphor is applied, and then the applied composition is cured, whereby a wavelength conversion layer is formed that covers the LED element, the reflective layer, and the partition.

SUMMARY

However, delamination may occur between the wavelength conversion layer or other component that encapsulates the LED element/partition and, for example, the partition. Delamination of the component encapsulating the LED element will degrade reliability of the LED device.

According to one embodiment, a light emitting device comprises: a resin package including a plurality of leads including a first lead and a second lead, a first resin portion, a second resin portion, and a third resin portion, the first resin portion defining an outer lateral face of the resin package, the second resin portion extending around an element mounting region, and the third resin portion being located between the first lead and the second lead, such that the plurality of leads and the first resin portion define a recess having an inner side-wall surface, upper faces of the plurality of leads being partly located on a bottom face of the recess; a light-emitting element disposed in the element mounting region; a light-reflective member being located between the inner side-wall surface and the second resin portion inside the recess; and an encapsulant located in a region of the recess that is surrounded by the light-reflective member, the encapsulant covering the second resin portion and the light-emitting element. The second resin portion has a depression on a surface thereof. A part of the encapsulant is located inside the depression of the second resin portion.

According to certain embodiments of the present disclosure, a highly reliable light emitting device can be obtained.

DETAILED DESCRIPTION

Figure 1A:
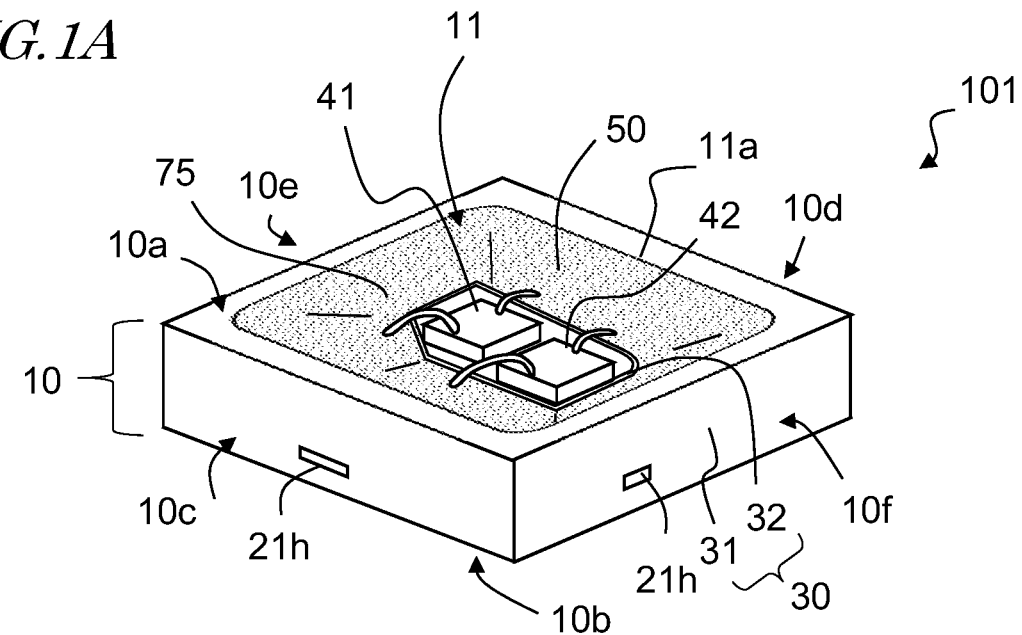
FIG. 1A is a schematic perspective view showing a light emitting device according to a first embodiment, as viewed from the upper face.

Hereinafter, light emitting devices according to the present disclosure will be described in detail with reference to the drawings. The following embodiments are illustrative, and the light emitting device construction according to the present invention is not limited to the following embodiments. In the description below, terms indicating a specific direction or position (e.g., "above", "below", or another term relating to such a term) may be used. Such terms are merely used for easier understanding of the relative directions and positions in the drawings referred to. The size, the positional relationship or the like of component elements in the drawings may be exaggerated for easier understanding, and may not reflect the sizes, or the positional relationship between the component elements in the actual light emitting device. In order to prevent excessive complexity, some elements may be omitted from illustration in the drawings.

In the description of the following embodiments, terms such as "resin package", "resin-attached lead frame", and "collective substrate" may be used irrespective of before or after the light-emitting elements, wires, etc., are provided.

First Embodiment

Light Emitting Device 101

Figure 1B:
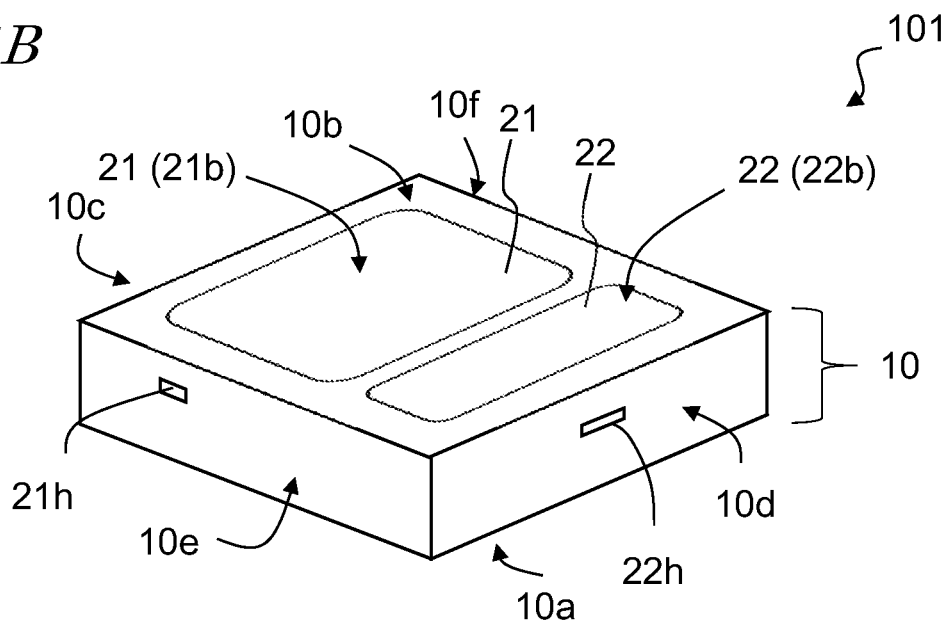
FIG. 1B is a schematic perspective view showing the light emitting device according to the first embodiment, as viewed from the lower face.

A light emitting device 101 according to a first embodiment of the present disclosure will be described. FIG. 1A and FIG. 1B are schematic perspective views showing the light emitting device 101 as viewed from the upper face and the lower face, respectively.

The light emitting device 101 includes a resin package 10, at least one light-emitting element, and a light-reflective member 50. The resin package 10, having a recess 11, is a housing for the light emitting device 101. In the exemplary construction illustrated in FIG. 1A and FIG. 1B, the light emitting device 101 includes two light-emitting elements 41 and 42. The light-emitting element 41 and the light-emitting element 42 are located in the recess 11 of the resin package 10.

The light emitting device 101 further includes an encapsulant 75 covering the light-emitting element 41 and the light-emitting element 42. In this example, the encapsulant 75 at least covers the light-emitting elements 41 and 42 and the light-reflective member 50 inside the recess 11. In FIG. 1A, in order to reveal the internal structure, the encapsulant 75 is illustrated as a transparent member. In other drawings of the present disclosure, too, the encapsulant 75 may also be shown as a transparent member as in FIG. 1A.

Hereinafter, the respective component elements will be described in detail.

Resin Package 10

The resin package 10 has an upper face 10a and a lower face 10b that is located on the opposite side from the upper face 10a. In the construction illustrated in FIG. 1A and FIG. 1B, in a top view, the resin package 10 has a substantially rectangular outer shape, with four outer lateral faces. The four outer lateral faces include an outer lateral face 10c, an outer lateral face 10d that is located on the opposite side from the outer lateral face 10c, an outer lateral face 10e, and an outer lateral face 10f that is located on the opposite side from the outer lateral face 10e. The outer shape of the resin package 10 in a top view is not limited to a rectangle, but may be other shapes.

The recess 11 formed in the resin package 10 has an opening 11a in the upper face 10a. The resin package 10 includes a resin body 30 and a plurality of leads that are integrally formed with the resin body 30. The resin body 30 includes: a first resin portion 31 composing the outer lateral faces 10c, 10d, 10e and 10f of the resin package 10; and a second resin portion 32 that is formed inside the recess 11 so as to surround the light-emitting elements 41 and 42. As will be described below, the second resin portion 32 has one or more depressions and/or one or more protrusions on its surface.

In the construction illustrated in FIG. 1A and FIG. 1B, the resin package 10 includes a first lead 21 and a second lead 22. As shown in FIG. 1B, a part of a lower face 21b of the first lead 21 and a part of a lower face 22b of the second lead 22 are exposed through the lower face 10b of the resin package 10. The first lead 21 and the second lead 22 are disposed so that the lower face 21b and the lower face 22b thereof are substantially coplanar.

As will be described below, the first lead 21 includes one or more extending portions 21h, and the second lead 22 also includes one or more extending portions 22h. As schematically shown in FIG. 1A and FIG. 1B, herein, end faces of the extending portions 21h, as parts of the first lead 21, are exposed through the outer lateral faces 10c, 10e and 10f of the resin package 10. Similarly, an end face of the extending portion 22h, as a part of the second lead 22, is exposed through the outer lateral face 10d of the resin package 10.

Figure 2A:
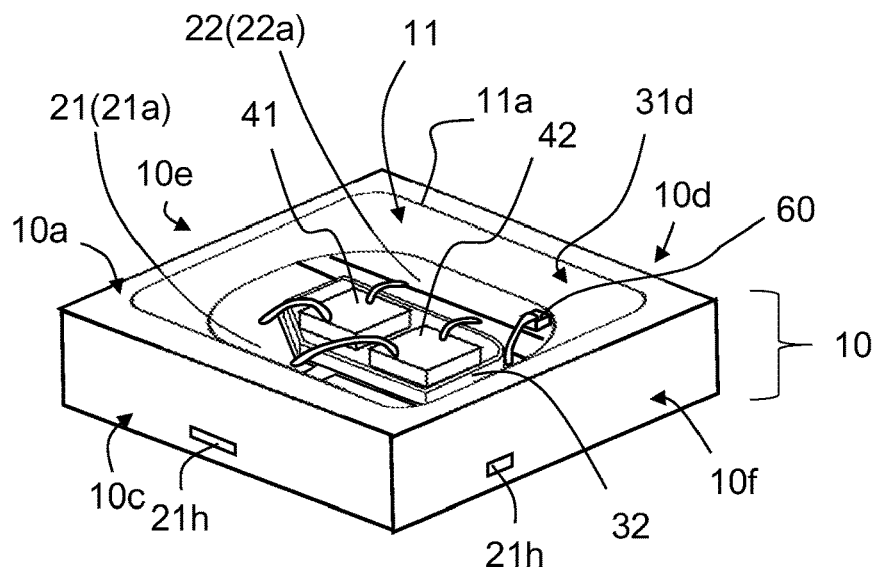
FIG. 2A is a schematic perspective view showing a structure excluding a light-reflective member from the light emitting device according to the first embodiment, as viewed from the upper face.
Figure 2B:
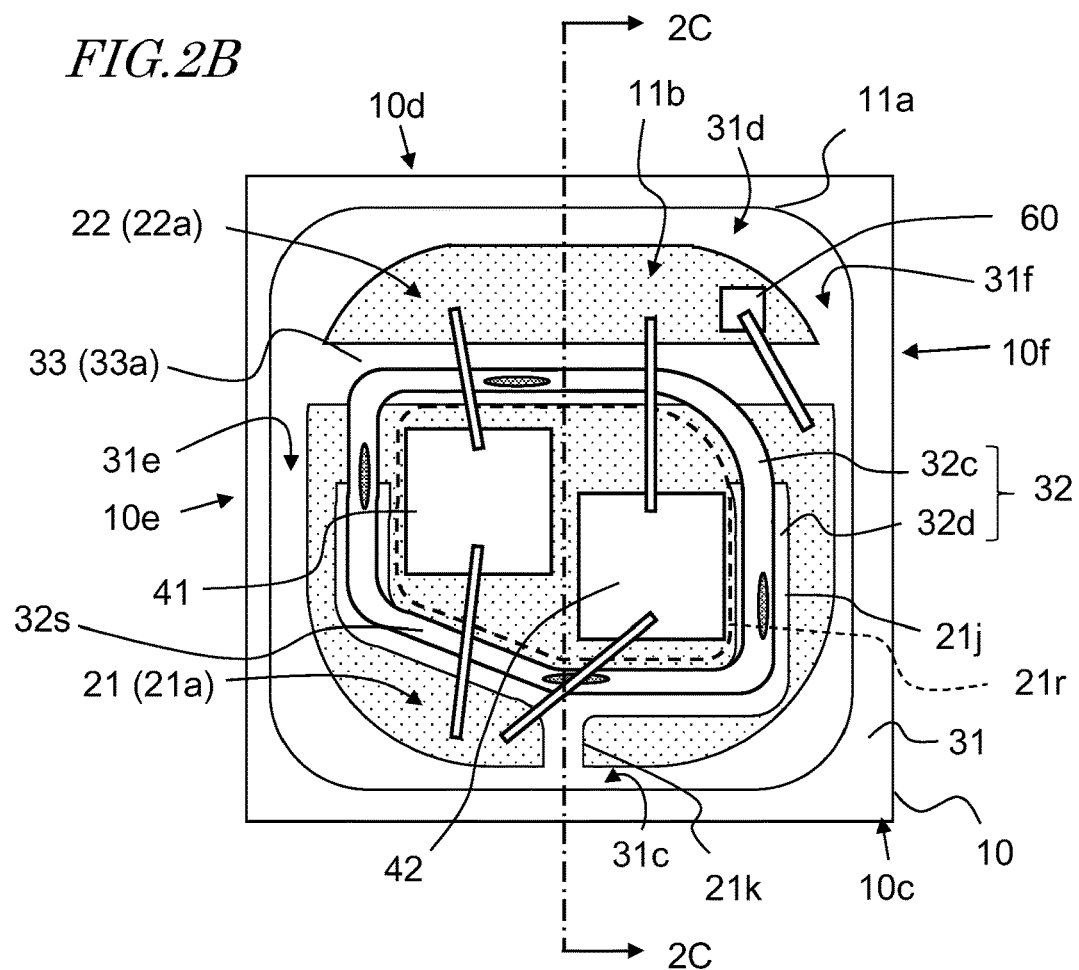
FIG. 2B is a schematic top view showing the structure excluding a light-reflective member from the light emitting device according to the first embodiment.
Figure 2C:
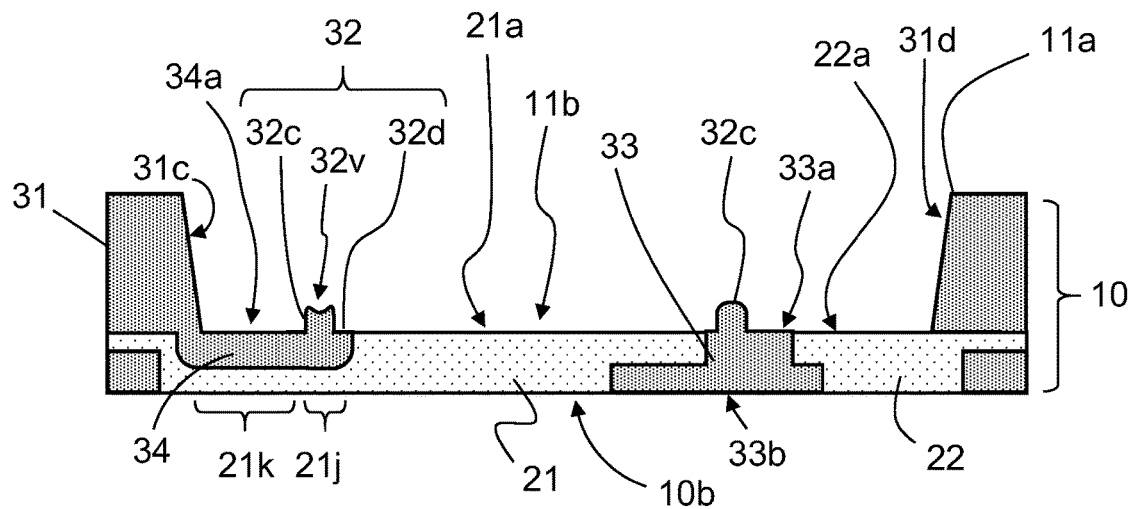
FIG. 2C is a schematic end view showing a cross section taken along line 2C-2C in FIG. 2B.

FIG. 2A is a schematic perspective view showing a structure excluding the encapsulant 75 and the light-reflective member 50 from the light emitting device 101, as viewed from the upper face. FIG. 2B is a schematic top view showing the structure excluding the encapsulant 75 and the light-reflective member 50 from the light emitting device 101. FIG. 2C schematically shows an end face obtained by cutting the structure at line 2C-2C in FIG. 2B. In FIG. 2C, in order to prevent excessive complexity of the drawing, wires (described below) that electrically connect the light-emitting element 42 and the first lead 21 to each other are omitted from illustration.

The first lead 21 has an upper face 21a that is located on the opposite side from the lower face 21b, whereas the second lead 22 has an upper face 22a that is located on the opposite side from the lower face 22b. In this example, the light-emitting elements 41 and 42 are disposed on the upper face 21a of the first lead 21, whereas a protection element 60 is disposed on the upper face 22a of the second lead 22. As shown in FIG. 2B, a part of the upper face 21a of the first lead 21 and a part of the upper face 22a of the second lead 22 are located on a bottom face 11b of the recess 11. As will be described below, the first lead 21 has a first groove 21j and a second groove 21k that are formed in its upper face 21a. The first groove 21j extends at least partially around the element mounting region 21r that is schematically indicated by a broken line in FIG. 2B, and the second groove 21k extends from the first groove 21j. The element mounting region 21r is a region in which the light-emitting elements 41 and 42 are mounted. Details of the first lead 21 and the second lead 22 will be described later.

Resin Body 30

The resin body 30 includes the first resin portion 31, the second resin portion 32, and a third resin portion 33 located between the first lead 21 and the second lead 22. A part of an upper face 33a of the third resin portion 33 is located on the bottom face 11b of the recess 11.

The first resin portion 31 includes inner lateral faces 31c, 31d, 31e and 31f, which are located on the opposite side from the outer lateral faces 10c, 10d, 10e and 10f of the resin package 10, respectively. As shown in FIG. 2B, the inner lateral face 31c and the inner lateral face 31d are opposed to each other, whereas the inner lateral face 31e and the inner lateral face 31f are opposed to each other. In this example, adjacent two of the inner lateral faces 31c, 31d, 31e and 31f are connected so as to constitute a curved surface, such that no clear border exists between the two inner lateral faces.

The inner lateral faces 31c, 31d, 31e and 31f constitute an inner side-wall surface of the recess 11. The recess 11 of the resin package 10 is defined by the inner lateral faces 31c, 31d, 31e and 31f of the first resin portion 31, a part of the upper face 21a of the first lead 21, and a part of the upper face 22a of the second lead 22.

In the resin package 10 shown in FIG. 2B, the opening 11a of the recess 11 has a substantially rectangular outer shape in a top view, with four rounded corners. In a top view, the outer edge of the bottom face 11b of the recess 11 is rounded so that it presents circular arcs with a larger radius than that of the four corners of the opening 11a at the positions of the four corners. In a top view, the resin package 10 may have an anode mark or a cathode mark that is formed by chamfering one of the corners of the opening 11a of the recess 11. The anode mark or cathode mark functions as a mark indicating the polarities of the first lead 21 and the second lead 22.

As shown in FIG. 2B, the second resin portion 32 of the resin body 30 extends around the element mounting region 21r. In the exemplary construction illustrated in FIG. 2B, a first subportion 32c of the second resin portion 32 has a loop shape that continuously surrounds the element mounting region 21r. Herein, a part of the first subportion 32c is located on the upper face 21a of the first lead 21, while another part is located on a second subportion 32d of the second resin portion 32. The remainder of the first subportion 32c is located on the upper face 33a of the third resin portion 33.

In the step of forming the light-reflective member 50, the second resin portion 32 restrains the light-reflective member 50 from covering the lateral faces of the light-emitting elements 41 and 42. As shown in FIG. 1A, the light-reflective member 50 is located between the inner side-wall surface of the recess 11 and the second resin portion 32. The light-reflective member 50 does not directly cover the lateral faces of the light-emitting elements 41 and 42, thereby restraining light emitted to a lateral side of the light-emitting elements 41 and 42 from being confined within the light-reflective member 50.

In this example, in a top view, the second resin portion 32 has a different outer shape from the outer shape of the light emitting device 101. The outer shape of the light emitting device 101, that is, the outer shape of the resin package 10, is substantially rectangular in a top view. On the other hand, the first subportion 32c of the second resin portion 32 herein has a substantially pentagonal outer shape in a top view. In the exemplary construction illustrated in FIG. 2B, in particular, the first subportion 32c has an oblique section 32s that extends obliquely with respect to the outer lateral face 10c in a top view. The first subportion 32c also has a circular arc section that connects between a portion that extends in parallel to the outer lateral face 10d in a top view and a portion that extends in parallel to the outer lateral face 10f in a top view.

As is best shown in FIG. 2C, the second resin portion 32 includes the first subportion 32c, which is located above the plane including the upper face 21a of the first lead 21, and the second subportion 32d, which is disposed in the first groove 21j of the first lead 21 and is located below the plane including the upper face 21a of the first lead 21. In the present embodiment, the first subportion 32c of the second resin portion 32 has one or more depressions 32v on its surface. Making the depressions 32v in the second resin portion 32 can provide an effect of increasing the surface area of the second resin portion 32. Moreover, forming the second subportion 32d of the second resin portion 32 in the first groove 21j of the first lead 21 can increase the area in which the second subportion 32d and the first lead 21 contact each other, thereby improving the adhesion therebetween. That is, the second resin portion 32 can be placed on the bottom face 11b more firmly.

Figure 2D:
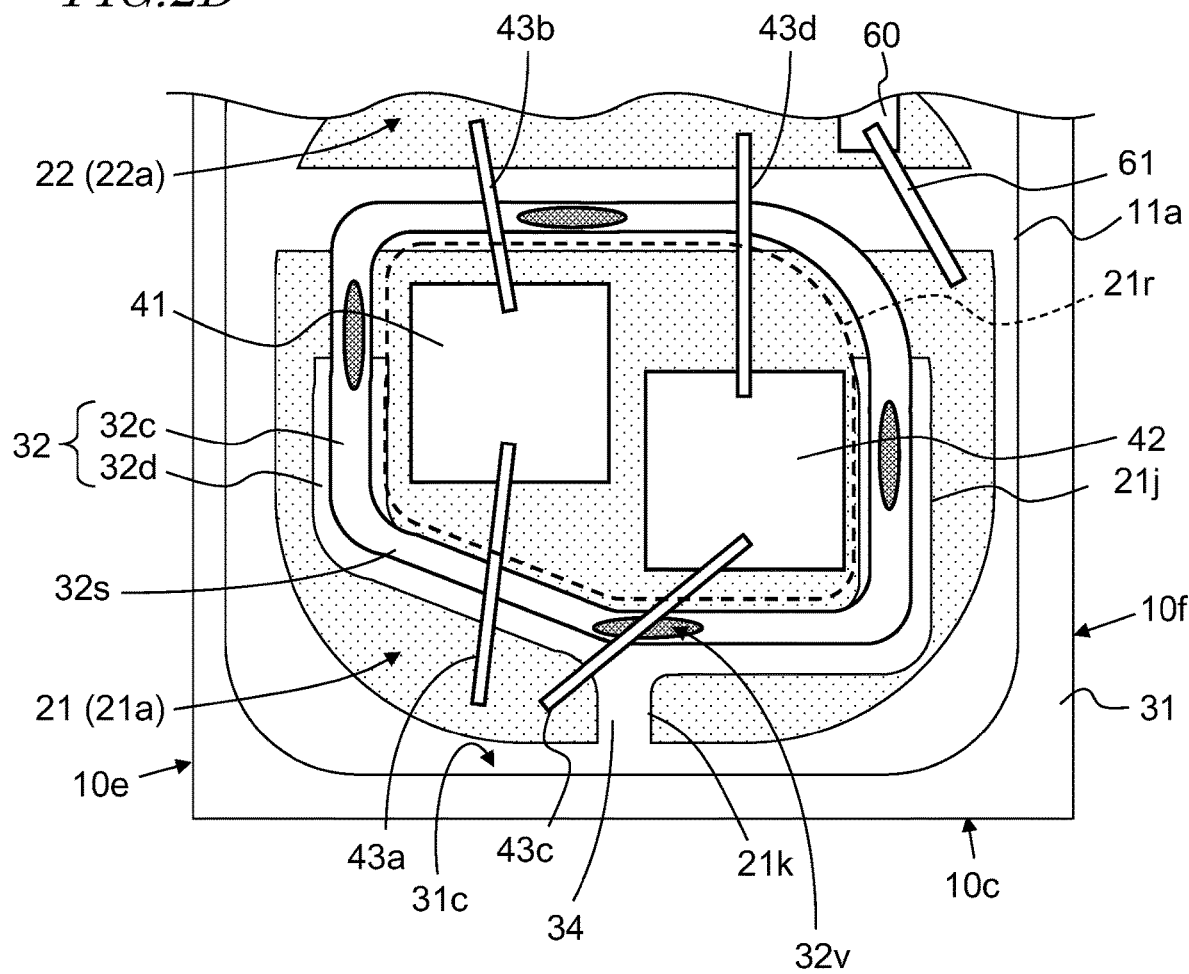
FIG. 2D is a schematic top view showing enlargement of a portion of FIG. 2B.

FIG. 2D shows enlarged view of a portion of FIG. 2B. As has been described with reference to FIG. 2C, herein, the first subportion 32c of the second resin portion 32 protrudes in a direction from the upper face 21a of the first lead 21 toward the opening 11a, with one or more depressions 32v formed in its surface. Although this example illustrates that a plurality of depressions 32v are formed in the first subportion 32c, there may only be one depression 32v.

As has been described with reference to FIG. 1A, the light emitting device 101 includes the encapsulant 75 covering the light-emitting element 41 and the light-emitting element 42. The encapsulant 75 also covers the second resin portion 32, which is disposed in the recess 11.

Figure 2E:
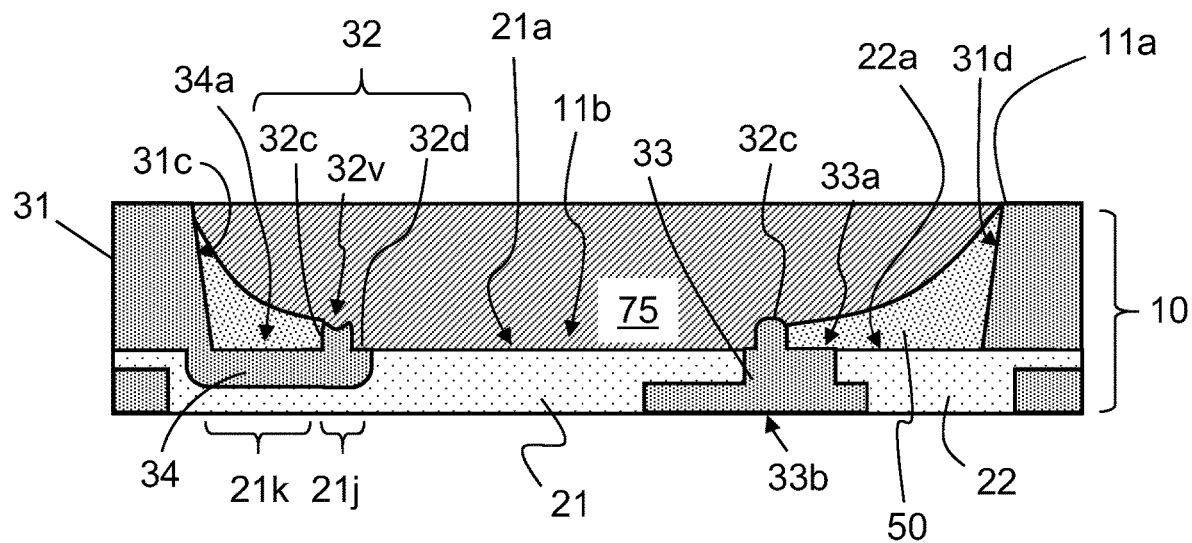
FIG. 2E is a schematic end view obtained by cutting the light emitting device 101 at the position of line 2C-2C shown in FIG. 2B.
Figure 2F:
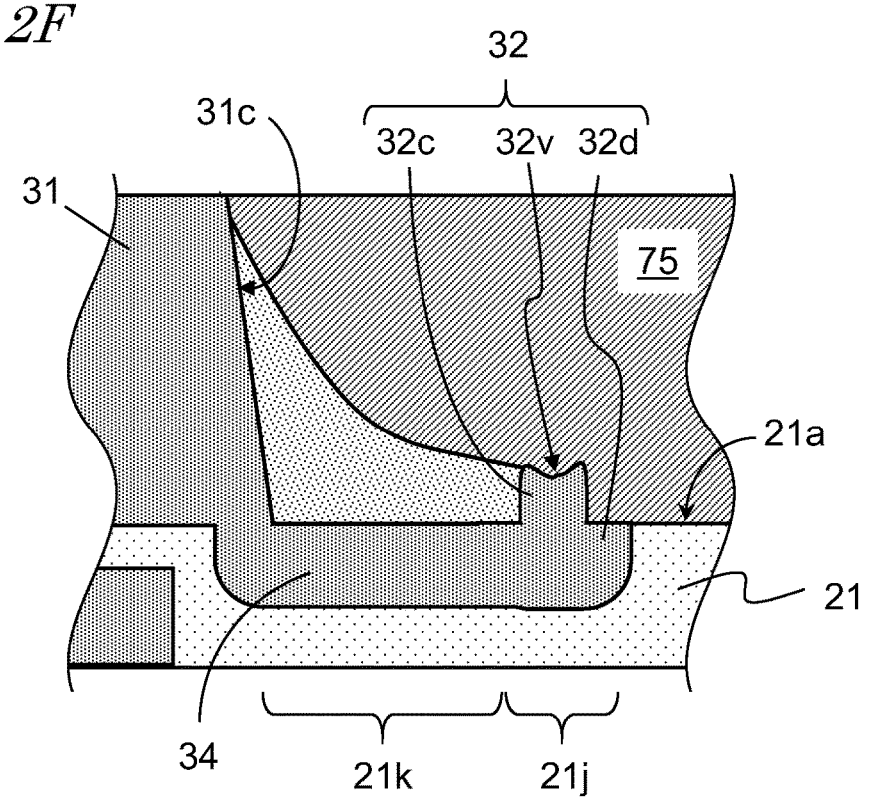
FIG. 2F is a schematic end view showing enlargement of a depression 32v shown in FIG. 2E and a vicinity thereof.

FIG. 2E schematically shows a cross section obtained by cutting the light emitting device 101 at the position of line 2C-2C shown in FIG. 2B. FIG. 2F schematically shows enlargement of a depression 32v shown in FIG. 2E and a vicinity thereof. In FIG. 2E and FIG. 2F, a hatched portion represents the encapsulant 75. In FIG. 2E, for simplicity, a wire 43c that electrically connects the light-emitting element 42 and the first lead 21 to each other (see FIG. 2D) is omitted from illustration.

As schematically shown in FIG. 2F, in the present embodiment, a part of the encapsulant 75 is located inside the depression 32v of the second resin portion 32. Providing the depressions 32v in the second resin portion 32 and forming the encapsulant 75 such that a part thereof is located inside each depression 32v allows the contact area between the second resin portion 32 and the encapsulant 75 to be increased. The increased contact area between the second resin portion 32 and the encapsulant 75 makes for firmer adhesion between the second resin portion 32 and the encapsulant 75. Accordingly, the encapsulant 75 is less likely to delaminate from the second resin portion 32, whereby reliability of the light emitting device 101 is improved.

See FIG. 2D again. In the exemplary construction illustrated in FIG. 2D, the depressions 32v are shaped so as to extend mainly along the direction that the second resin portion 32 extends. One of them is located near a site of the first subportion 32c at which the second resin portion 32 and a resin connecting portion 34 (described below) are connected. The resin connecting portion 34 is disposed in the second groove 21k of the first lead 21, with one end being connected to the second subportion 32d of the second resin portion 32, and the other end being in contact with the inner lateral face 31c of the first resin portion 31. In this example, one of the depressions 32v is located below the wire 43c that electrically connects the light-emitting element 42 to a portion of the upper face 21a of the first lead 21 that is located outside the element mounting region 21r. In other words, a part of the wire 43c is located above the depression 32v of the second resin portion 32.

The light-emitting element 42 further has a wire 43d connected thereto, with one end of the wire 43d being connected to the second lead 22. Similarly, wires 43a and 43b are connected at one end to the light-emitting element 41, the other ends of the wires 43a and 43b being connected to, respectively, a portion of the first lead 21 that is located outside the element mounting region 21r and the second lead 22. As can be seen from FIG. 2B and FIG. 2D, herein, a part of the first lead 21 and a part of the second lead 22 are exposed in between the second resin portion 32 and the inner side-wall surface of the recess 11. Allowing a part of the first lead 21 and a part of the second lead 22 to be thus exposed in between the second resin portion 32 and the inner side-wall surface of the recess 11 is a way of providing a region to which a wire having one end connected to the light-emitting element is connected at its other end.

Figure 3:
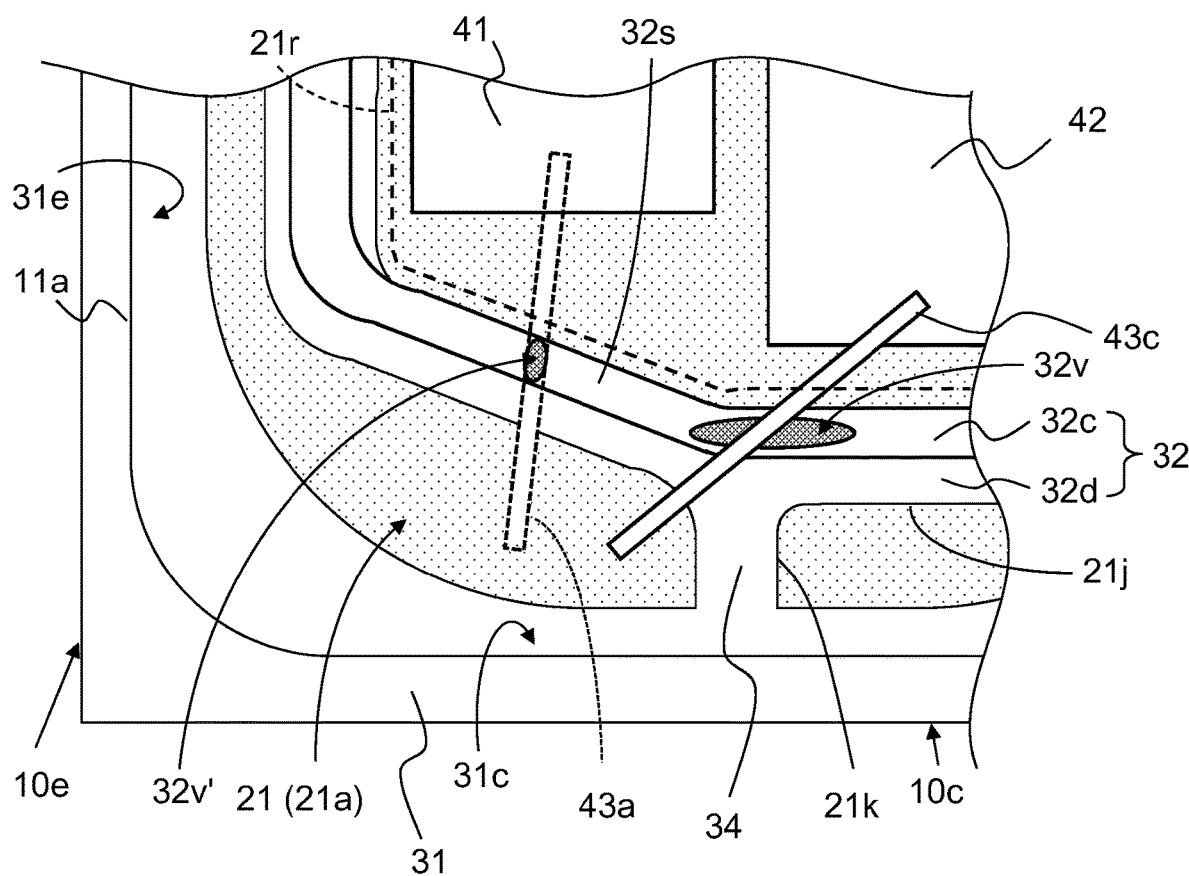
FIG. 3 is a schematic top view showing another example regarding the shapes and positioning of depressions.

As illustrated in FIG. 3, the second resin portion 32 may have a depression 32v' extending along a direction that intersects the direction that the second resin portion 32 extends in a top view. In the example shown in FIG. 3, the wire 43a is disposed astride the depression 32v'. The depression 32v' is formed so that at least a portion of the depression 32v' is located below a wire that electrically connects the light-emitting element disposed in the element mounting region 21r to the first lead 21 or the second lead 22, thereby facilitating placement of the. The depression 32v' may have a shape that connects the region inside the first subportion 32c of the second resin portion 32 to the region outside the first subportion 32c. As long as at least a portion of the surface of the first subportion 32c that belongs in the depression 32v' protrudes from the upper face 21a of the first lead 21, a function of stopping the uncured resin material to be the light-reflective member 50 is achieved. A shape extending along the direction that the second resin portion 32 extends, as of the aforementioned depression 32v, is advantageous because it allows the contact area between the second resin portion 32 and the encapsulant 75 to be increased while securing the function of stopping the uncured resin material.

Furthermore, in this example, the depression 32v' is located at the oblique section 32s of the first subportion 32c. As can be seen from FIG. 3, the oblique section 32s has a large distance from the inner lateral faces 31c and 31e that constitute the inner side-wall surface of the recess 11, compared to a portion of the first subportion 32c that extends in parallel to the outer lateral face 10c and a portion of the first subportion 32c that extends in parallel to the outer lateral face 10e. The fact that the depression is located at a farther position of the first subportion 32c from the inner side-wall surface of the recess 11 reduces the possibility that, in the process of providing the light-reflective member 50, the uncured resin material to be the light-reflective member 50 may intrude into the element mounting region 21r beyond the first subportion 32c. In other words, this likely to avoid that the light-reflective member 50 covers the lateral faces of the light-emitting elements 41 and 42.

Thus, by ensuring that the outer shape of the second resin portion 32 in a top view is different from the outer shape of the light emitting device 101, and providing, for example, the oblique section 32s in the first subportion 32c, it becomes possible to dispose a depression at a farther position from the inner side-wall surface of the recess 11. As will be described in detail later, the light-reflective member 50 can be formed by dropping uncured resin material in the region between the inner side-wall surface of the recess 11 and the second resin portion 32, spreading the resin material by flowing, and thereafter curing the resin material, for example. In other words, regarding the bottom face 11b of the recess 11, the region between the inner side-wall surface of the recess 11 and the first subportion 32c of the second resin portion 32 may function as a flow path for the uncured resin material to flow. Therefore, providing a depression in a portion of the first subportion 32c excluding any portion having a smaller distance from the inner side-wall surface of the recess 11 is advantageous in restraining the lateral faces of the light-emitting elements 41 and 42 from becoming covered by the light-reflective member 50.

Any other options for the shape, number, and positioning of depressions in the first subportion 32c of the second resin portion 32 are applicable other than the example described with reference to FIGS. 2C through 2F and FIG. 3. For example, a depression may be located at a bent portion that connects two portions of the first subportion 32c that extend in parallel to the outer lateral face of the resin package 10 (e.g., a portion that extends in parallel to the outer lateral face 10c and a portion that extends in parallel to the outer lateral face 10f). Alternatively, a plurality of depressions may be provided in the second resin portion 32; and, in addition to a depression(s), one or more protrusions protruding from the surface of the first subportion 32c may be provided on the first subportion 32c of the second resin portion 32. In the example shown in FIG. 2C, FIG. 2E, and FIG. 2F, the depression 32v is illustrated as being near a summit of the first subportion 32c. However, the positions of the depressions and protrusions along the height direction from the bottom face 11b of the recess 11 may be appropriately selected. The shape of a depression in a cross-sectional view can be appropriately selected. Moreover, the shape of a depression in a top view can be appropriately selected other than an ellipse as exemplified by FIG. 3, and may be an indefinite shape, for example.

The maximum value of the width of a depression 32v in a top view may be about the same as the width of the first subportion 32c. As used herein, the "width" of a depression 32v means the distance between both ends of the depression 32v along a direction perpendicular to the direction that the subject depression 32v is elongated, while the "width" of the first subportion 32c means the distance between both ends of the first subportion 32c along a direction perpendicular to the longitudinal direction of the first subportion 32c.

FIG. 2C and FIG. 2D are referred to. As described above, the resin package 10 may further include the resin connecting portion 34 located on the bottom face 11b of the recess

11. The resin connecting portion 34 is a portion of the resin body 30 that is located between the second resin portion 32 and the first resin portion 31, this portion connecting the second resin portion 32 and the first resin portion 31 to each other. As shown in FIG. 2C, herein, the resin connecting portion 34 does not protrude from the upper face 21a of the first lead 21, but the upper face 34a of the resin connecting portion 34 and the upper face 21a of the first lead 21 are at substantially the same height. By ensuring that the upper face 34a of the resin connecting portion 34 is at substantially the same height as the upper face 21a of the first lead 21, when the uncured resin material to be the light-reflective member 50 is introduced onto the bottom face 11b of the recess 11, the uncured resin material can be allowed to flow naturally on the bottom face 11b, without being obstructed by the resin connecting portion 34. Even in the case in which the resin connecting portion 34 protrudes from the upper face 21a of the first lead 21, lowering the height of the resin connecting portion 34 relative to the height of the second resin portion 32 can restrain the resin connecting portion 34 from obstructing the flow of uncured resin material. Accordingly the material of the light-reflective member 50 can spread over the bottom face 11b.

By providing in the resin package 10 the resin connecting portion 34, which connects the second resin portion 32 and the first resin portion 31 to each other, the second resin portion 32 is less likely to delaminate from the bottom face 11b of the recess 11. Formation of the resin connecting portion 34 contributes to improved reliability of the light emitting device 101.

As described above, the resin body 30 includes the third resin portion 33, which is located between the first lead 21 and the second lead 22. As shown in FIG. 2C, the upper face 33a of the third resin portion 33 is located on the bottom face 11b of the recess 11. The upper face 33a is at the same height as the upper face 21a of the first lead 21 and the upper face 22a of the second lead 22, and thus does not protrude from the upper face 21a of the first lead 21 or the upper face 22a of the second lead 22.

The third resin portion 33 has a lower face 33b that is located on the opposite side from the upper face 33a. The lower face 33b of the third resin portion 33 is located on the lower face 10b of the resin package 10. As shown in FIG. 2B, the third resin portion 33 is connected to a wall portion having the inner lateral face 31e of the first resin portion 31 and a wall portion having the inner lateral face 31f of the first resin portion 31.

On the upper face 33a of the third resin portion 33, a part of the first subportion 32c of the second resin portion 32 is located. With this positional relationship between the second resin portion 32 and the third resin portion 33, when uncured resin material to be the resin body 30 flows into a die by molding technique, the resin material can be introduced from a space for forming the third resin portion 33 into a space for forming the second resin portion 32, inside the die. When a part of the first subportion 32c of the second resin portion 32 is connected to the third resin portion 33, there is an advantage in that the second resin portion 32 is restrained from becoming delaminated and leaving the resin package 10.

The resin body 30 is formed by using a resin material. As the resin material to serve as the base material, a thermosetting resin, a thermoplastic resin, or the like may be used. Examples of the resin material to serve as the base material include: epoxy resin compositions, silicone resin compositions, modified epoxy resin compositions such as silicone-modified epoxy resins, modified silicone resin compositions such as epoxy-modified silicone resin, unsaturated polyester resins, saturated polyester resins, polyimide resin compositions, and modified polyimide resin compositions; and resins such as polyphthalamide (PPA), polycarbonate resins, polyphenylenesulfide (PPS), liquid crystal polymers (LCP), ABS resins, phenol resins, acrylic resins, and PBT resins. In particular, use of a thermosetting resin such as an epoxy resin composition or a modified silicone resin composition will be advantageous because the first resin portion 31, the second resin portion 32, and the third resin portion 33 can be integrally formed from the same resin material.

The material to be the resin body 30 can have a viscosity of 10 Pa·s to 40 Pa·s in an uncured state. Such viscosities are advantageous because the material to be the resin body 30 can sufficiently flow in the die, and the first resin portion 31, the second resin portion 32, the third resin portion 33 and the resin connecting portion 34 can be formed altogether by molding technique. It may be more advantageous for the material to be the resin body 30 to have a viscosity of 15 Pa·s to 25 Pa·s in an uncured state.

It may be advantageous for the resin material to serve as the base material of the resin body 30 to contain a light-reflective substance. As the light-reflective substance, materials that are unlikely to absorb light from the light-emitting element, and that have a large refractive index difference with respect to the base of the resin material can be used. Examples of such light-reflective substances include titanium oxide, zinc oxide, silicon oxide, zirconium oxide, aluminum oxide, aluminum nitride, and the like.

The base of the resin material to be the resin body 30 may contain: carbon such as acetylene black, active carbon, or graphite; a transition metal oxide such as iron oxide, manganese dioxide, cobalt oxide, or molybdenum oxide; a colored organic pigment; or the like. By forming the resin body 30 in black or a color resembling black, the reflectance of the resin body 30 with respect to external light (which in many cases is sunlight) can be lowered, and the contrast ratio between the portion of the light emitting device 101 from which light exits and other portion can be improved.

First Lead 21, Second Lead 22

The first lead 21 and the second lead 22 are electrically conductive, and function as electrodes for supplying power to the light-emitting elements 41 and 42. The number of leads in the resin package 10 can be appropriately determined other than two of the first lead 21 and the second lead 22, and the resin package 10 may further include a third lead, for example. The third lead may function as an electrode for power supplying purposes, or function as a heat dissipation member. In the case in which the resin package 10 includes a third lead in addition to the first lead 21 and the second lead 22, the third resin portion 33 of the resin body 30 may be positioned between the first lead 21 and the third lead, and between the second lead 22 and the third lead, for example.

Figure 4A:
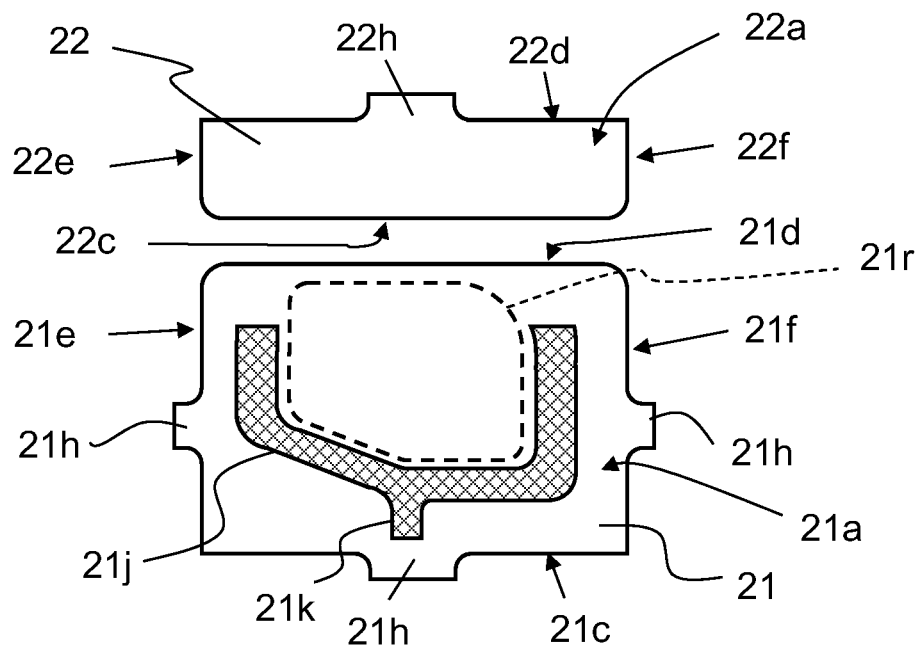
FIG. 4A is a schematic top view of a first lead and a second lead.
Figure 4B:
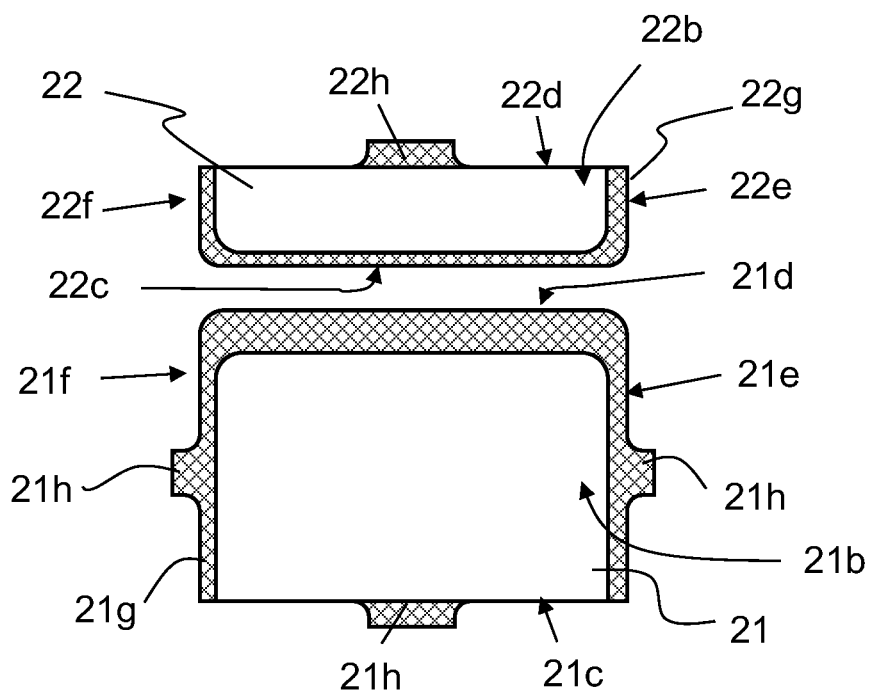
FIG. 4B is a schematic bottom view of a first lead and a second lead.

FIG. 4A is a schematic top view showing the first lead 21 and the second lead 22 out of the light emitting device 101. FIG. 4B is a schematic bottom view showing the first lead 21 and the second lead 22 out of the light emitting device 101. The first lead 21 may have, for example, a substantially rectangular shape, with lateral portions 21c, 21d, 21e and 21f. The lateral portion 21d faces the second lead 22. The lateral portion 21c is located on the opposite side from the lateral portion 21d. The lateral portion 21e and the lateral portion 21f are located on the opposite side from each other, and do not face the second lead 22.

Subsequently, the center of each of the lateral portions 21c, 21e and 21f in a top view, an extending portion 21h is located. The extending portions 21h are parts of the first lead 21. As shown in FIG. 1A and FIG. 1B, an end face of each of the extending portions 21h positioned in the lateral portions 21c, 21e and 21f may be exposed from the resin body 30 respectively on the outer lateral faces 10c, 10e and 10f of the resin package 10. Herein, the end faces of the respective extending portions 21h are substantially coplanar with the outer lateral faces 10c, 10e and 10f of the resin package 10.

As shown cross-hatched in FIG. 4A, the first lead 21 includes the first groove 21j in the upper face 21a, which is located on the bottom face 11b of the recess 11, and the second groove 21k having one end continued to the first groove 21j. As described above, herein, the first groove 21j extends at least partially around the element mounting region 21r. In some cases, the first groove 21j may extend entirely around the element mounting region 21r, that is, around the entire circumference. The first groove 21j and the second groove 21k may be formed by an etching process, a pressing process, or the like.

As shown hatched in FIG. 4B, on its lower face 21b, the first lead 21 has a lateral peripheral groove 21g that follows along the lateral portions 21d, 21e and 21f. The lateral peripheral groove 21g is concaved from the lower face 21b toward the upper face 21a. Portions of the lateral peripheral groove 21g that are alongside the lateral portions 21e and 21f are embedded in the first resin portion 31. Forming the resin body 30 so that the lateral peripheral groove 21g is located in the first resin portion 31 can realize improved adhesion between the resin body 30 and the first lead 21. The lateral peripheral groove 21g can be formed by an etching process, a pressing process, or the like.

Similarly to the first lead 21, the second lead 22 may have, for example, a substantially rectangular shape, with lateral portions 22c, 22d, 22e and 22f. In the resin package 10, the first lead 21 and the second lead 22 are located at a predetermined interval, such that the lateral portion 22c of the second lead 22 faces the lateral portion 21d of the first lead 21.

Near the center of the lateral portion 22d in a top view, an extending portion 22h is located. The extending portion 22h is a part of the second lead 22. As shown in FIG. 1B, an end face of the extending portion 22h of the lateral portion 22d may be exposed from the resin body 30 on the outer lateral face 10d of the resin package 10. Herein, an end face of the extending portion 22h is substantially coplanar with the outer lateral face 10d of the resin package 10.

As shown cross-hatched in FIG. 4B, the second lead 22 has a lateral peripheral groove 22g that extends along the lateral portions 22c, 22e and 22f of the lower face 22b. The lateral peripheral groove 22g is concaved from the lower face 22b toward the upper face 22a. Portions of the lateral peripheral groove 22g that are alongside the lateral portions 22e and 22f are embedded in the first resin portion 31. Forming the resin body 30 so that the lateral peripheral groove 22g is located in the first resin portion 31 can realize improved adhesion between the resin body 30 and the second lead 22. The lateral peripheral groove 22g can be formed by an etching process, a pressing process, or the like. Hereinafter, portions of the second lead 22 excluding the extending portion 22h, and portions of the first lead 21 excluding the extending portions 21h, may be referred to as their main body parts.

The first lead 21 and the second lead 22 can be obtained by cutting apart a lead frame (which includes: a frame portion; a plurality of pairs each including a portion defining the main body part of the first lead 21 and a portion defining the main body part of the second lead 22; and a plurality of connecting portions that join these pairs with the frame portion) at the positions of the connecting portions. In the lead frame, the aforementioned extending portions 21h and extending portion 22h configure parts of the connecting portions, which join the portions defining the main body parts of the first leads 21 and portions defining the main body parts of the second leads 22 with the frame portion. As will be described below, the resin body 30 integrally formed with a lead frame is cut at the connecting portions of the lead frame, thereby obtaining singulated light emitting devices 101. Through such a step, the extending portions 21h and the extending portion 22h, which have been parts of the connecting portions, become exposed on the outer lateral faces 10c, 10d, 10e and 10f of the resin package 10, so as to be substantially coplanar with the surface of the resin body 30. Once separated individually, the main body part of the first lead 21 and the extending portions 21h constitute the first lead 21. Similarly, once singulated individually, the main body part of the second lead 22 and the extending portion 22h constitute the second lead 22.

In the present embodiment, the first lead 21 has a greater area than does the second lead 22 in a top view, because the first lead 21 includes the element mounting region 21r. Alternatively, the element mounting region 21r may be provided in the second lead 22. In the case in which the element mounting region 21r is provided in the second lead 22 the area of the second lead 22 may be greater than the area of the first lead 21 in a top view. The element mounting region 21r may be provided across both of the first lead 21 and the second lead 22. In this case, the first lead 21 and the second lead 22 may have substantially the same area in a top view.

The resin package 10 may include a third lead in addition to the first lead 21 and the second lead 22. In the case in which the resin package 10 includes a third lead, for example, the element mounting region 21r may be provided in the first lead 21. The first lead 21 may be provided, for example, between the second lead 22 and the third lead, in which case the second lead 22 and the third lead may have substantially the same area, and the area of the first lead 21 may be greater than the area of the second lead 22 and greater than the area of the third lead, in a top view.

Each of the first lead 21 and the second lead 22 may include a base member and a metal layer covering the base member. The base member typically has a plate-like shape. The base member may contain a metal such as copper, aluminum, gold, silver, iron, nickel, or an alloy thereof; phosphor bronze; iron-containing copper; or the like. These may be of a single layer, or have a multilayer structure, for example, a clad material. From the standpoints of cost and heat-releasing ability, it may be advantageous to select copper as the material of the base member. The metal layer may contain e.g. silver, aluminum, nickel, palladium, rhodium, gold, copper, or an alloy thereof, etc.

The first lead 21 and the second lead 22 may each have a region where substantially no metal layer is provided. In the first lead 21 and the second lead 22, the metal layer formed on the upper faces 21a and 22a and metal layer on the lower faces 21b and 22b may be different. For example, the metal layer formed on the upper faces 21a and 22a may be a metal layer including a plurality of layers including a nickel layer, whereas the metal layer formed on the lower faces 21b and 22b may be a metal layer that does not substantially include a nickel layer.

Light-Emitting Elements 41 and 42

See FIG. 2D again. As the light-emitting elements 41 and 42, semiconductor light-emitting elements such as light-emitting diode elements can be used. Although two light-emitting elements, in other words, light-emitting elements 41 and 42 are installed in the light emitting device 101, the number of light-emitting elements included in the light emitting device 101 can be appropriately determined other than this example. There may be one light-emitting element, or three or more light-emitting elements. In particular, the light-emitting elements 41 and 42 may each contain a nitride semiconductor ($In_xAl_yGa_{1-x-y}N$, $0 \leq x$, $0 \leq y$, $x+y \leq 1$) capable of emission in the ultraviolet to visible ranges. For example, the light-emitting elements 41 and 42 may respectively emit blue light and green light. In the case in which the light emitting device includes three light-emitting elements, the three light-emitting elements may respectively emit blue light, green light, and red light.

The light-emitting elements 41 and 42 are located in the element mounting region 21r of the first lead 21, and is joined with the first lead 21 by a joining member. The joining member may be, for example: resins including the resin materials that have been exemplified as the material of the resin body 30; tin-bismuth based, tin-copper based, tin-silver based, gold-tin based, solder or other solders; electrically conductive pastes or bumps, e.g., silver, gold, or palladium; anisotropic conductive materials; or brazing materials such as low-melting point metal materials.

As has already been described, the light-emitting element 41 is electrically connected to the first lead 21 and the second lead 22 by the wires 43a and 43b. Similarly, the light-emitting element 42 is electrically connected to the first lead 21 and the second lead 22 by the wires 43c and 43d. Herein, between the first lead 21 and the second lead 22, the light-emitting element 41 and the light-emitting element 42 are connected in parallel. The light-emitting element 41 and the light-emitting element 42 may be connected in series.

Protection Element 60

The light emitting device 101 may include a protection element 60. The protection element 60 improves the ESD withstand voltage of the light emitting device 101. As the protection element 60, any of the various protection elements that may be mounted in generic light emitting devices, for example, a Zener diode, can be used. The protection element 60 may be disposed on the upper face 22a of the second lead 22, and embedded in the light-reflective member 50, for example. Forming the light-reflective member 50 so as to cover the protection element 60 can restrain that light from the light-emitting elements 41 and 42 is absorbed by the protection element 60.

The protection element 60 is typically connected in parallel to the light-emitting elements 41 and 42. In this example, one of the two terminals of the protection element 60 is connected to the upper face 21a of the first lead 21 by a wire 61. The other terminal of the protection element 60 is electrically connected to the upper face 22a of the second lead 22 via, for example, solder, electrically conductive paste, a bump, an anisotropic conductive material, or a brazing material such as a low-melting point metal material.

Light-Reflective Member 50

Figure 5:
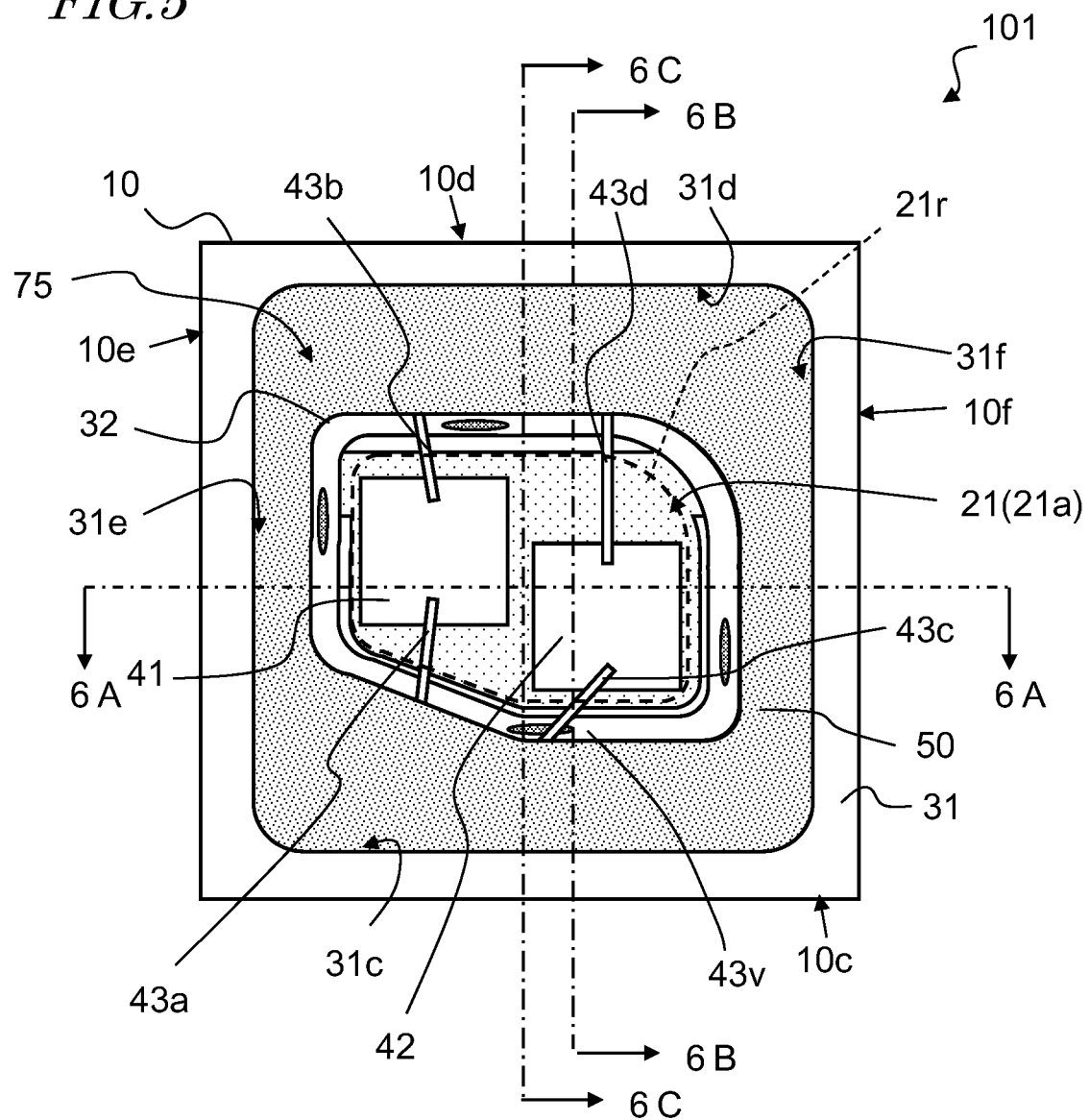
FIG. 5 is a schematic top view of the light emitting device according to the first embodiment.

See FIG. 5. FIG. 5 is a schematic top view of the light emitting device 101. As shown shaded in FIG. 5, the light-reflective member 50 is located in a region between the circumference of the inner lateral faces 31c, 31d, 31e and 31f of the recess 11 and the circumference of the second resin portion 32, in a top view. As will be seen from a comparison between FIG. 2B and FIG. 5, in the recess 11, the light-reflective member 50 is formed so as to cover: the inner lateral faces 31c, 31d, 31e and 31f; a part of the upper face 21a of the first lead 21 that is located outside the second resin portion 32; the upper face 22a of the second lead 22; and a part of the upper face 33a of the third resin portion 33. The light-reflective member 50 is not provided in the region inside the second resin portion 32, that is, in the element mounting region 21r. The aforementioned second resin portion 32 may be regarded as a structure that defines where the inner edge of the light-reflective member 50 is.

Figure 6A:
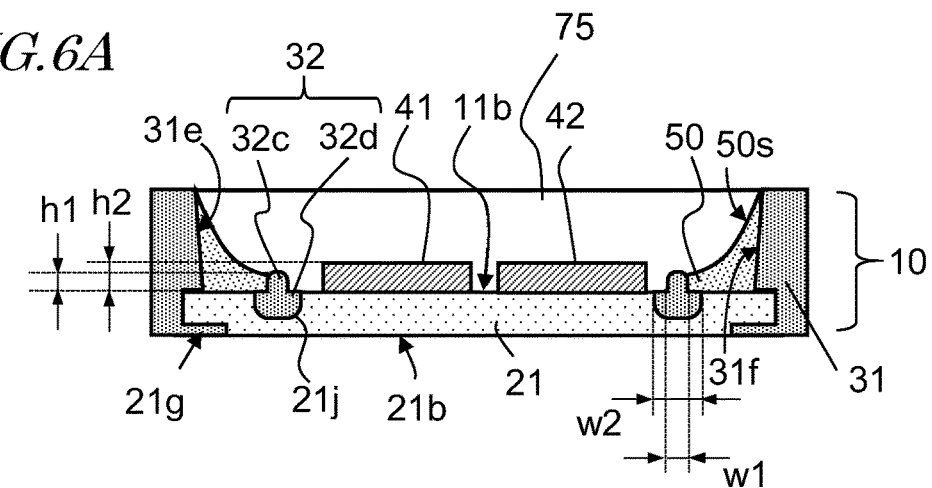
FIG. 6A is a schematic end view showing a cross section taken along line 6A-6A in FIG. 5.
Figure 6B:
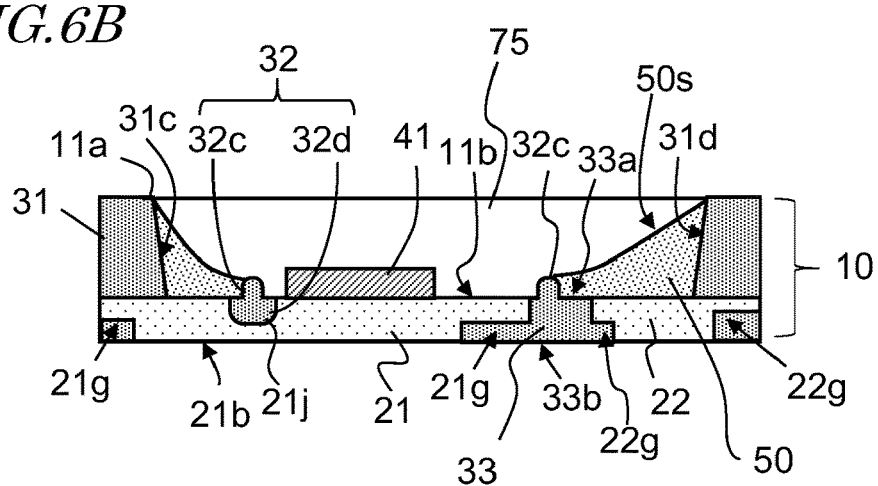
FIG. 6B is schematic end view showing a cross section taken along line 6B-6B in FIG. 5.
Figure 6C:
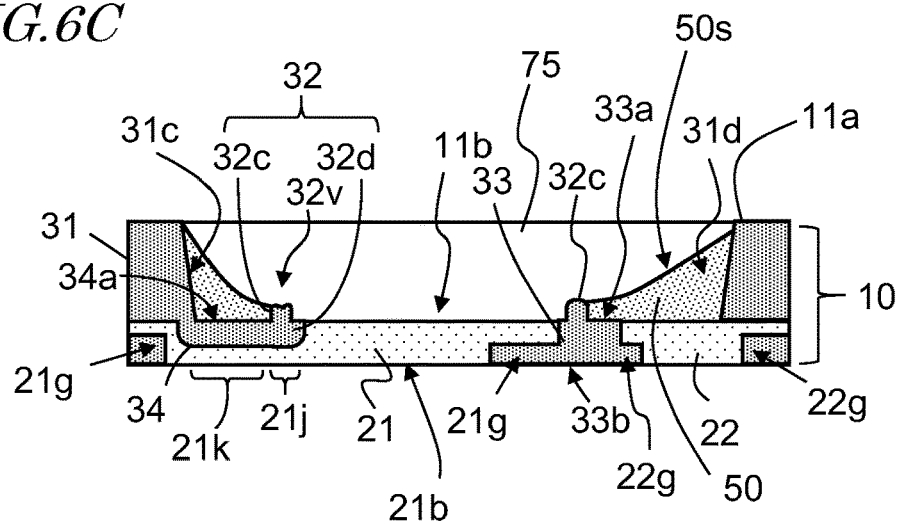
FIG. 6C is a schematic end view showing a cross section taken along line 6C-6C in FIG. 5.

FIG. 6A schematically shows an end face as being cut at line 6A-6A in FIG. 5. FIG. 6B schematically shows an end face as being cut at line 6B-6B in FIG. 5. FIG. 6C schematically shows an end face as being cut at line 6C-6C in FIG. 5.

As shown in FIGS. 6A through 6C, the light-reflective member 50 has a sloped surface 50s extending between the inner lateral faces 31c, 31d, 31e and 31f and the second resin portion 32. The sloped surface 50s is concaved toward the bottom face 11b of the recess 11. The light-reflective member 50 allows light emitted from the light-emitting elements 41 and 42 and incident on the light-reflective member 50 to be reflected at the sloped surface 50s toward the opening 11a of the recess 11, thus improving the light extraction efficiency of the light emitting device 101.

The angle of tilt defined by a straight line connecting an upper end and a lower end of the sloped surface 50s and by the bottom face 11b of the recess 11 can be smaller than the angle of tilt defined by a straight line connecting an upper end and a lower end of the inner lateral face (e.g., the inner lateral face 31d) of the first resin portion 31 and by the bottom face 11b of the recess 11. This is because the light-reflective member 50 may be formed closer to the light-emitting element than is the first resin portion 31. By forming the light-reflective member 50 so as to be near the light-emitting element, light emitted from the light-emitting elements 41 and 42 and incident on the light-reflective member 50 can be efficiently reflected toward the opening 11a.

In this example, the first subportion 32c of the second resin portion 32 has a height h1 in the upward direction from the upper face 21a of the first lead 21. If the height h1 of the first subportion 32c is lower than the height h2 of the light-emitting elements 41 and 42 in the upward direction from the upper face 21a, it becomes easier for the light emitted from the light-emitting elements 41 and 42 to be incident on the sloped surface 50s of the light-reflective member 50, and easier for the light emitted from the light-emitting elements 41 and 42 to efficiently exit from the opening 11a to the exterior. Accordingly, this structure may be advantageous.

It may be advantageous that the light-reflective member 50 is configured by a material having a low transmittance with respect to light from the light-emitting element and external light or the like, or a material that is unlikely to absorb light from the light-emitting element and external light or the like. The light-reflective member 50 may be configured by a mixture of a resin and light scattering particles, for example. For instance, as the base material of the light-reflective member 50, a thermosetting resin, a thermoplastic resin, or the like may be used. Specific examples of base materials include phenol resins, epoxy resins, BT resins, polyphthalamide (PPA), silicone resins, and the like. By having a configuration a reflective material that is unlikely to absorb light from the light-emitting element and has a refractive index difference with respect to the base material to be dispersed in a resin serving as the base material, the light-reflective member 50 can more efficiently reflect light. It may be advantageous for the light-reflective member 50 to have a white color. As the reflective material, light scattering particles of titanium oxide, zinc oxide, silicon oxide, zirconium oxide, aluminum oxide, aluminum nitride, or the like can be used.

It may be advantageous that the reflectance of the light-reflective member 50 with respect to the light emitted from the light-emitting element is higher than the reflectance of the resin body 30. For example, the content of a reflective material such as titanium oxide that is dispersed in the light-reflective member 50 may be greater than the content of the light-reflective substance that is dispersed in the resin body 30. The content of the reflective material in the light-reflective member 50 is preferably at least 1.5 times as large as the content of the light-reflective substance in the resin body 30, more preferably at least 2 times as large, and still more preferably at least 2.5 times as large. For example, in the uncured resin material to be the resin body 30, titanium oxide may account for 15 to 20% by weight. In this case, titanium oxide may account for 30 to 60% by weight in the uncured resin material to be the light-reflective member 50.

It is advantageous that the viscosity of the resin material to be the light-reflective member 50 in an uncured state is lower than the viscosity of the material to be the resin body 30 in an uncured state. For example, the viscosity of the light-reflective member 50 in an uncured state is preferably 1 Pa·s to 20 Pa·s, and more preferably 5 Pa·s to 15 Pa·s. By adjusting the viscosity of the uncured resin material to be the light-reflective member 50 to this range, good fluidity can be obtained when introducing the material of the light-reflective member 50 into the recess 11, thereby restraining the possibility of insufficient filling of the light-reflective member 50. It may be advantageous that the light-reflective member 50 has high thixotropy in an uncured state.

In the exemplary construction illustrated in FIGS. 6A through 6C, the width w1 of the first subportion 32c of the second resin portion 32 is smaller than the width w2 of the first groove 21j of the first lead 21. By reducing the width w1 of the first subportion 32c, when forming the light-reflective member 50, an adequate path for flowing the uncured material can be obtained. This can provide an effect in that the light-reflective member 50 can be efficiently formed, and that the surface of the light-reflective member 50 to serve as a reflective surface is easier to be inclined. As a result, light emitted from the light-emitting elements 41 and 42 can be efficiently led upward direction. Moreover, increasing the width w2 of the first groove 21j relative to the width w1 of the first subportion 32c allows the area in which the second resin portion 32 and the first lead 21 contact each other to be increased, thereby reducing the possibility of detachment of the second resin portion 32 from the first lead 21.

Encapsulant 75

The encapsulant 75 is located in a region of the recess 11 that is surrounded by the light-reflective member 50, and covers the light-emitting elements 41 and 42 and the second resin portion 32 of the resin body 30 located on the bottom of the recess 11. In other words, the encapsulant 75 mainly occupies portions of the recess 11 excluding the light-emitting elements 41 and 42, the second resin portion 32, and the light-reflective member 50. With this structure, the light-emitting elements 41 and 42 can be protected from external force, dust, moisture, and the like, by being covered with the encapsulant 75.

As the material for forming the encapsulant 75, similarly to the base material composing the resin body 30, resin materials such as thermosetting resins, thermoplastic resins, etc., can be used. As the base material for forming the encapsulant 75, it may be advantageous to choose a material having a transmittance of 60% or more with respect to light emitted from the light-emitting elements 41 and 42, and more advantageous that the transmittance with respect to light emitted from the light-emitting elements 41 and 42 is 90% or more. As the material of the encapsulant 75, for example, silicone resins, epoxy resins, acrylic resins, or resin materials containing one or more of these can be used. The encapsulant 75 may be configured by a single layer, or consist of a plurality of layers. In the resin to serve as the base material, a light scattering particles such as titanium oxide, silicon oxide, zirconium oxide, or aluminum oxide may be dispersed.

The encapsulant 75 may contain a material that converts the wavelength of the light from the light-emitting elements 41 and 42, e.g., a phosphor. As the phosphor, yttrium aluminum garnet activated by cerium, lutetium aluminum garnet activated by cerium, nitrogen-containing calcium aluminosilicate activated by europium and/or chromium (where a part of calcium may be substituted with strontium), SiAlON activated by europium, silicate activated by europium, strontium aluminate activated by europium, potassium fluorosilicate activated by manganese, or the like can be used. The content of the entire light scattering particles and/or phosphor to be dispersed in the base material may be, for example, about 10 to about 150% by weight with respect to the resin material serving as the base material of the encapsulant 75.

Wires 43a Through 43d, Wire 61

As the wires 43a through 43d and wire 61, for example, a wire configured by a metal such as gold, copper, silver, platinum, aluminum, palladium, or an alloy containing one or more of these may be used. A wire that is made of a material in which silicon or the like is mixed may be used for the wires 43a through 43d and/or the wire 61. A wire containing gold as the material may be advantageous because the wire can have a good thermal resistance or the like and is unlikely to break due to stress from the encapsulant 75. A wire containing silver as the material may be also advantageous because the wire can exhibit high light reflectance. In particular, it may be advantageous to use wires containing both gold and silver. In the case in which the wires 43a through 43d and/or the wire 61 is a wire(s) containing both gold and silver, silver may be contained in a ratio that is not less than 15% and not more than 20%, not less than 45% and not more than 55%, not less than 70% and not more than 90%, or not less than 95% and not more than 99%. In particular, when silver is contained in a ratio not less than 45% and not more than 55%, the likelihood of sulfuration may be reduced while achieving high light reflectance. The wire diameter may be chosen as appropriate, e.g., not less than 5 μm and not more than 50 μm. The wire diameter may more preferably be not less than 10 μm and not more than 40 μm, and still more preferably be not less than 15 μm and not more than 30 μm.

Method of Producing the Light Emitting Device 101

An embodiment of a method of producing a light emitting device according to the present disclosure will be described. A method of producing a light emitting device according to the present disclosure includes: step (A) of providing a collective substrate; and step (B) of singulating the collective substrate into a plurality of light emitting devices. Hereinafter, these steps will be described in detail.

(A) Step of Providing a Collective Substrate

Figure 7A:
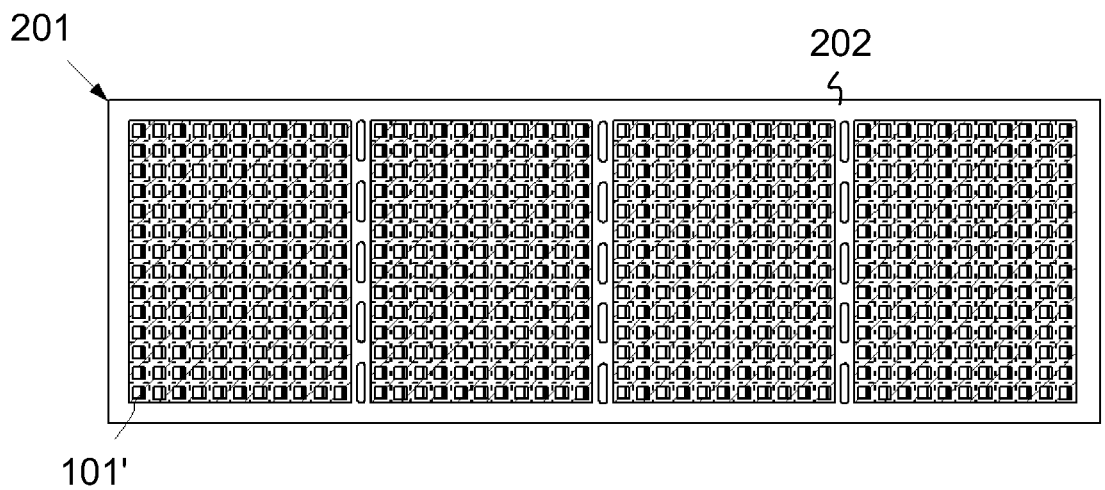
FIG. 7A is a schematic top view of a collective substrate 201.
Figure 7B:
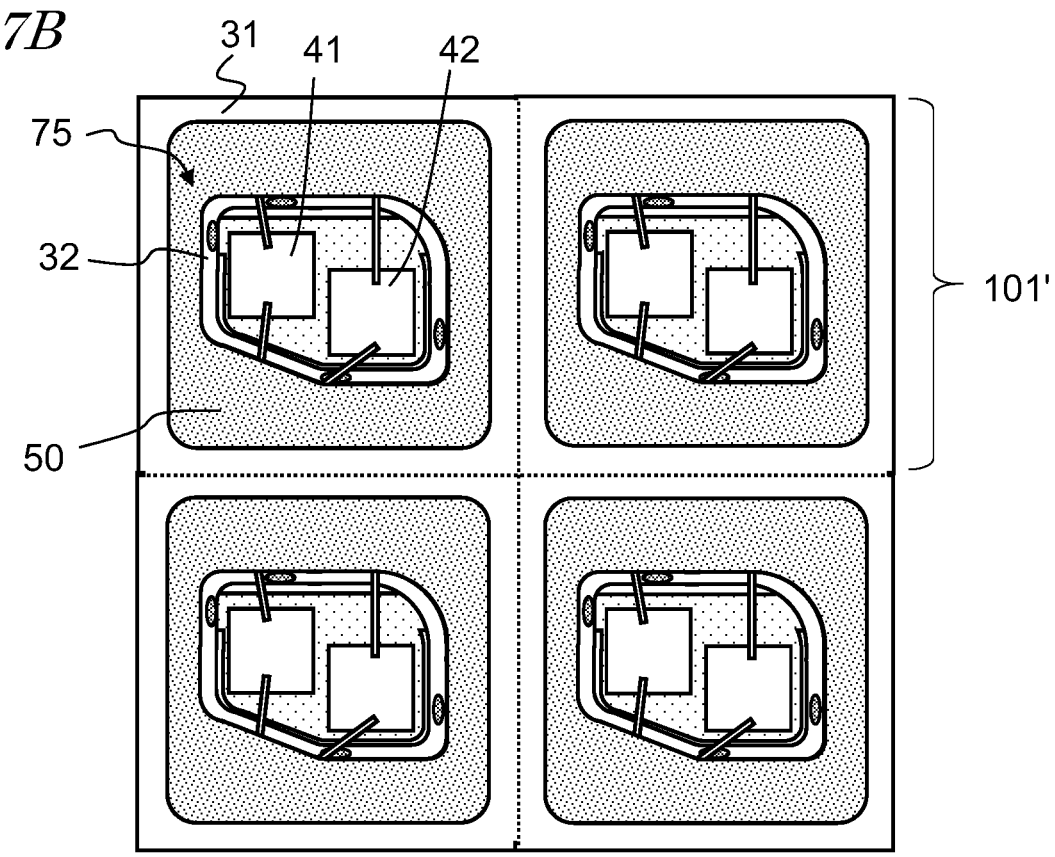
FIG. 7B is a schematic top view showing four light emitting device-defining regions.

FIG. 7A is a schematic top view of a collective substrate 201. The collective substrate 201 includes the lead frame 202 as a part thereof. In the collective substrate 201, a plurality of portions (hereinafter referred to as light emitting device-defining regions 101'), each of which will become a light emitting device, are arranged in a two-dimensional array. FIG. 7B is a schematic top view showing four light emitting device-defining regions 101' out of them. Except for not having been singulated yet, each light emitting device-defining region 101' is identical in structure to the light emitting device 101 that has been described with reference to FIGS. 1A through 6C.

Figure 8:
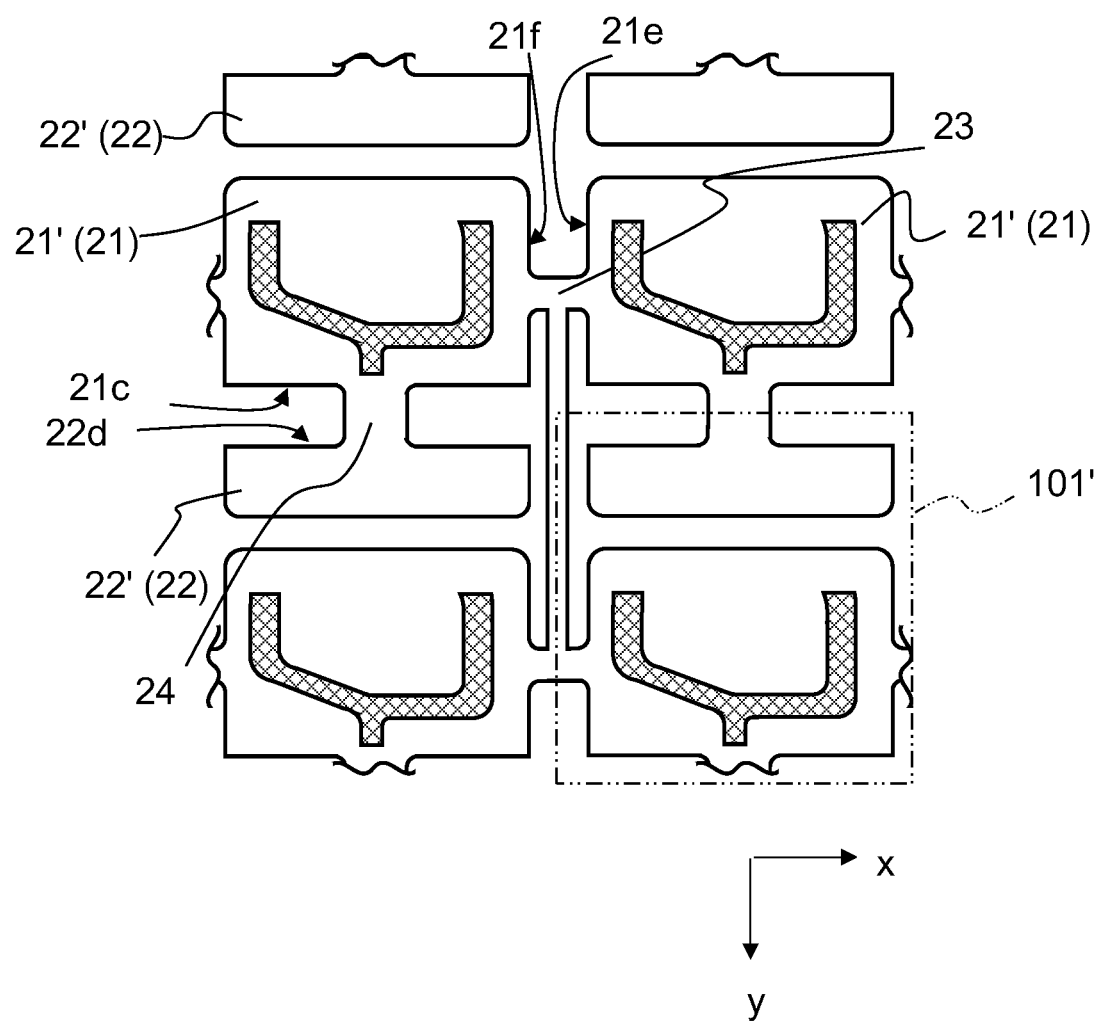
FIG. 8 is a schematic top view showing portions of a lead frame 202 corresponding to four light emitting device-defining regions.

FIG. 8 shows the lead frame 202 out of the collective substrate 201. In FIG. 8, those of the plurality of light emitting device-defining regions 101' corresponding to four light emitting device-defining regions 101' are representatively shown. In FIG. 8, a rectangle bounded by a double-dot dashed line indicates a portion corresponding to one light emitting device-defining region 101'.

As shown in FIG. 8, in each light emitting device-defining region 101', a pair configured by a portion to become the first lead 21 (hereinafter referred to as a first lead-defining region 21') and a portion to become a second lead 22 (hereinafter referred to as a second lead-defining region 22') is created. In the example shown in FIG. 8, first lead-defining regions 21' and second lead-defining regions 22' are alternately arranged along the y direction as shown in FIG. 8. Moreover, along the x direction, which is orthogonal to the y direction, a plurality of first lead-defining regions 21' or second lead-defining regions 22' are arranged. Along the y direction in FIG. 8, a connecting portion 24 connects between the lateral portion 21c of a first lead-defining region 21' and the lateral portion 22d of a second lead-defining region 22'. Along the x direction, a connecting portion 23 connects between the lateral portion 21e of a first lead-defining region 21' and the lateral portion 21f of an adjacent first lead-defining region 21'.

The collective substrate 201 can be obtained by, for example, after providing a resin-attached lead frame including the resin bodies 30 formed on the lead frame 202, placing the light-emitting elements 41 and 42 and the like in the resin-attached lead frame, and further forming the light-reflective members 50 and encapsulants 75.

The resin-attached lead frame can be produced by forming the resin bodies 30 on the lead frame 202. Formation of the resin bodies 30 on the lead frame 202 may be achieved by: a transfer molding method, an injection molding method, a compression molding method, or the like. For example, the lead frame 202 may be disposed between a die configured by an upper die and a lower die, and the resin material may be allowed to flow into the spaces within the die, whereby the resin-attached lead frame can be formed.

Figure 9A:
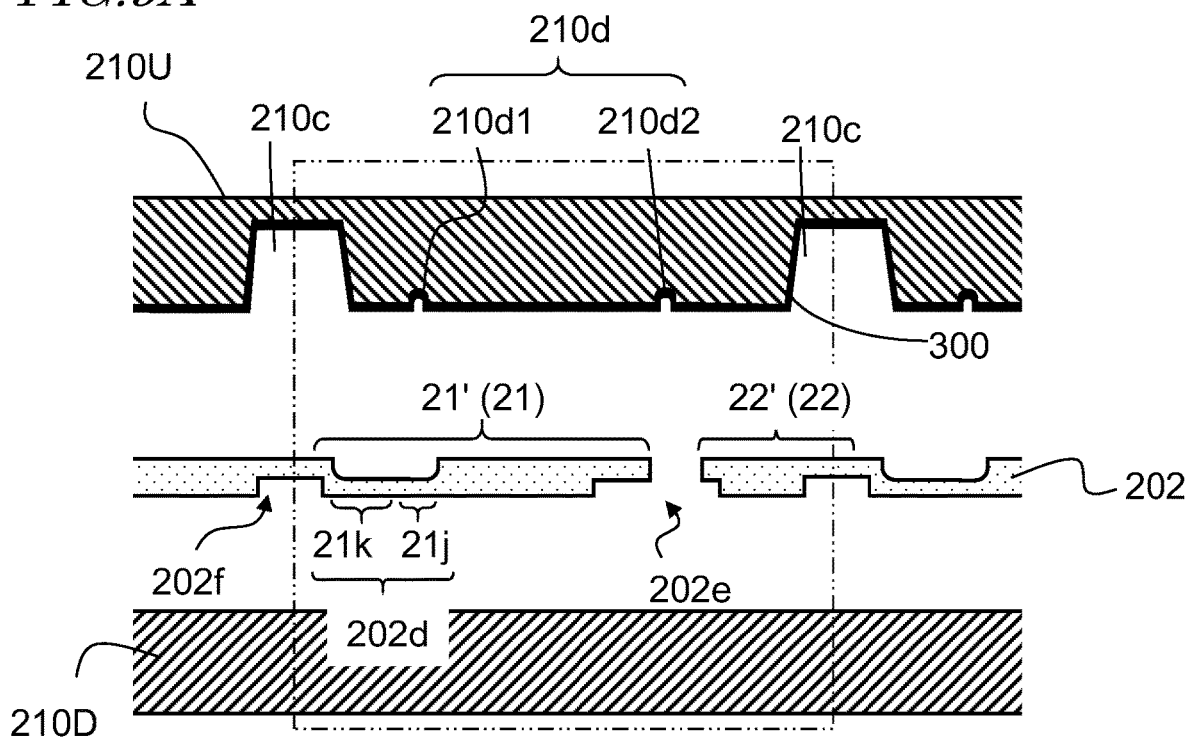
FIG. 9A is a cross-sectional view showing a production step of a light emitting device according to the first embodiment.

FIG. 9A shows the lead frame 202 being disposed between the upper die 210U and the lower die 210D. In FIG. 9A, a rectangle bounded by a double-dot dashed line indicates a portion corresponding to the cross section shown in FIG. 2C.

As shown in the figure, the upper die 210U includes a first space 210c for forming the first resin portion 31 and a second space 210d for forming the first subportion 32c of the second resin portion 32. On the other hand, the lower die 210D has no space therein according to the present embodiment. In the upper die 210U, the second space 210d does not communicate with the first space 210c, and is an independent space. The second space 210d includes a space 210d1 and a space 210d2.

The lead frame 202 located between the upper die 210U and the lower die 210D includes third spaces 202e on the lower face side, fourth spaces 202d on the upper face side, and fifth spaces 202f on the lower face side. Each third space 202e corresponds to the shape of the third resin portion 33. The third resin portion 33 can be formed by filling the third space 202e with a resin material, and curing the resin material. Each fourth space 202d of the lead frame 202 includes the first groove 21j and the second groove 21k of the first lead 21. The second subportion 32d of the second resin portion 32 and the resin connecting portion 34 can be formed by filling the fourth space 202d with a resin material, and curing the resin material. The resin material filling each fifth space 202f and being cured may constitute a part of the first resin portion 31.

When placing the lead frame 202 between the upper die 210U and the lower die 210D, a release sheet 300 can be disposed between the upper die 210U and the lead frame 202, as shown in FIG. 9A according to the present embodiment. Presence of the release sheet 300 between the die and the lead frame 202 can alleviate the cured resin material from adhering to the die. Therefore, even if the uncured resin material filling the spaces within the die has a relatively low viscosity, the cured resin material can be easily separated from the die. Moreover, cleaning of the die may be unnecessary per each shot, for example. A sheet that is capable of expanding and contracting to some extent can be used for the release sheet 300. The release sheet 300 can be, for example, a resin sheet-materials or a resin film-like materials, for example, a fluoroplastic-based resin film that is commercially available under the designation "ETFE film". The release sheet 300 may be configured by a single layer, or a plurality of layers. The release sheet 300 may have a thickness of, for example, not less than about 12 micrometers and not more than about 100 micrometers can be used.

Figure 9B:
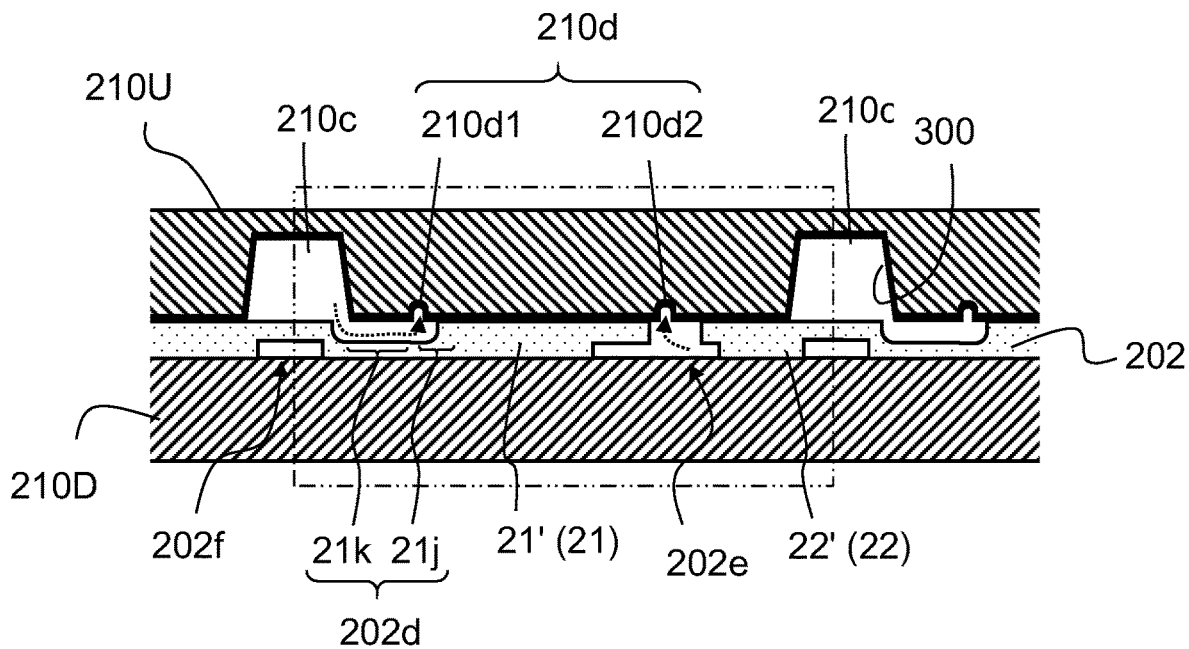
FIG. 9B is a cross-sectional view showing a production step of a light emitting device according to the first embodiment.

FIG. 9B shows the lead frame 202 being sandwiched between the upper die 210U and the lower die 210D. As described above, in the upper die 210U, each first space 210c and each second space 210d are separated. However, by sandwiching the lead frame 202 between the upper die 210U and the lower die 210D as shown in FIG. 9B, each first space 210c of the upper die 210U becomes connected to the second groove 21k of a fourth space 202d of the lead frame 202. Similarly, each space 210d1 of the upper die 210U becomes connected to the first groove 21j of a fourth space 202d of the lead frame 202. Moreover, the space 210d2 of each second space 210d of the upper die 210U becomes connected to a third space 202e of the lead frame 202. In the state shown in FIG. 9B, each first space 210c also communicates with a fifth space 202f.

Because the spaces in the upper die 210U and the spaces in the lead frame 202 are connected in the aforementioned manner, as uncured resin material to become the resin body 30 is introduced into the spaces in the die (i.e., spaces being sandwiched between the upper die 210U and the lower die 210D), these spaces are filled with the uncured resin material. As indicated by a broken-lined arrow in FIG. 9B, the uncured resin material filling the first space 210c is transferred to the space 210d1 of the second space 210d via the second groove 21k and the first groove 21j of the fourth space 202d. Similarly, as indicated by a broken-lined arrow in FIG. 9B, the uncured resin material filling the third space 202e is transferred from the third space 202e into the space 210d2 of the second space 210d. As a result, the uncured resin material enters into all spaces. The space 210d1 and the space 210d2, which are shown separate in FIG. 9A and FIG. 9B, define two cross sections of an annular space, and communicate with each other in the state shown in FIG. 9B.

Thus, according to the method of producing a light emitting device of the present disclosure, when forming the resin body 30, the second groove 21k of the first lead 21, in which the resin connecting portion 34 of the resin body 30 is formed, functions as a gate into the second space 210*d* for forming the second resin portion 32. As a result, when producing the resin package 10 through molding using a die, the second resin portion 32 can be formed at the same time the first resin portion 31 and the third resin portion 33 are formed.

As described above, when introducing the resin material, the second space 210*d* becomes connected with other spaces at a plurality of sites within the die. In this example, the second space 210*d* is connected to the first space 210*c* for forming the first resin portion 31 and also to the third space 202*e* for forming the third resin portion 33, via the fourth space 202*d* including the first groove 21*j* and the second groove 21*k*. Because the uncured resin material is supplied to the second space 210*d* from a plurality of sites, insufficient filling of the resin material is less likely to occur in the second space 210*d* within the die.

As shown in FIG. 4A, the second groove 21*k* functioning as a gate may be connected to the first groove 21*j* substantially at a middle portion with respect to both ends of the portion of the first groove 21*j* that extends along the substantial right-left direction on the plane of the figure, for example. As the second groove 21*k* is connected substantially at the middle portion of both ends of the first groove 21*j*, the uncured resin material that has been transferred from the first space 210*c* to the second groove 21*k* of the fourth space 202*d* can be split at the position where the second groove 21*k* is connected to the first groove 21*j*, thus to flow in two directions inside the first groove 21*j* and inside the space 210*d*1 of the die. As a result, the second space 210*d* can be filled with the uncured resin material in a shorter period of time and more uniformly.

After introducing the uncured resin material, the resin material in the die is pre-cured by heating. When introducing the uncured resin material, for example, the clamping pressure to be applied to the upper die 210U and the lower die 210D may be adjusted so as to intentionally cause creases in the release sheet 300. The clamping pressure may be, for example, not less than 500 kN and not more than 1200 kN. The creased release sheet 300 can make a part of the release sheet 300 to protrude into the second space 210*d*. The uncured resin material is introduced in this state and pre-cured in the die, thereby creating a depression(s) in the resin body in the second space 210*d*, at the position of the crease(s) formed in the release sheet 300.

Thereafter, the lead frame 202 to which the pre-cured resin material is attached may be taken out of the die, and then a main cure of the resin material is performed, heating at a higher temperature than in the pre-cure. As a result, a resin-attached lead frame is obtained in which each resin body 30 is formed on the lead frame 202. Through the main cure of the resin material, a second resin portion 32 can be obtained with a depression(s) at a position(s) corresponding to the crease(s) of the release sheet 300 in the die.

Figure 10:
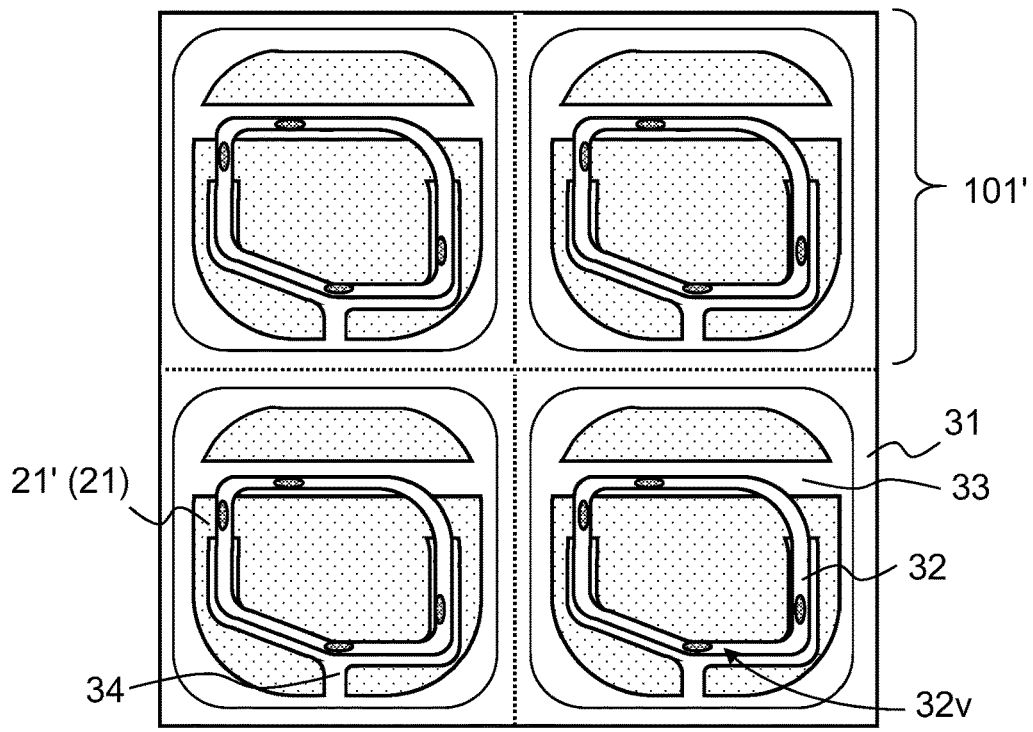
FIG. 10 is a schematic top view showing portions of a resin-attached lead frame including a plurality of light emitting device-defining regions that correspond to four light emitting device-defining regions.

FIG. 10 shows portions corresponding to four light emitting device-defining regions 101', out of the plurality of light emitting device-defining regions 101' of the resin-attached lead frame. Because the second space 210*d* and the first space 210*c* are connected to each other via the fourth space 202*d* including the first groove 21*j* and the second groove 21*k* and via the third space 202*e*, the second resin portion 32 is connected to the first resin portion 31 of the resin package 10 through the resin connecting portion 34 and the third resin portion 33. As a result, the second resin portion 32 is less likely to delaminate from the upper face of the first lead-defining region 21'.

Figure 11:
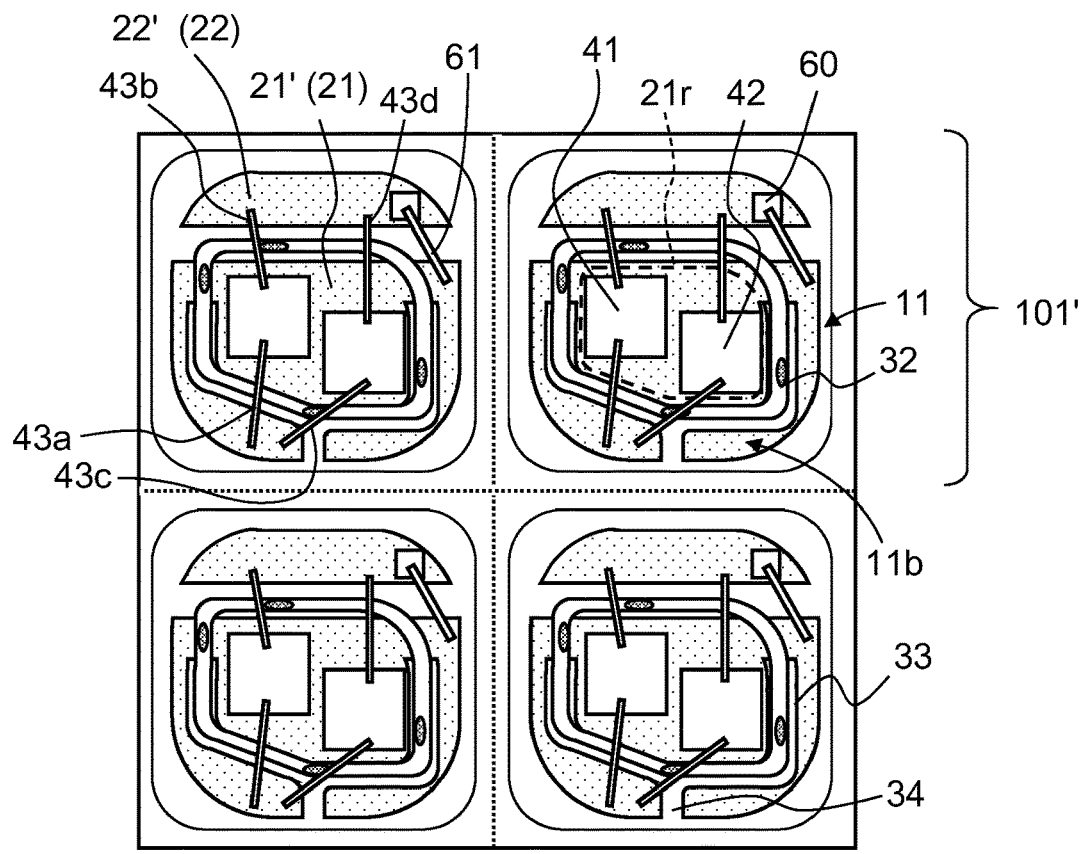
FIG. 11 is a schematic top view showing light-emitting elements being mounted in an element mounting region of a first lead-defining region.

Subsequently, as shown in FIG. 11, the light-emitting elements 41 and 42 are placed inside the recess 11 in each light emitting device-defining region 101'. For example, by using a joining member of resin or the like, the light-emitting elements 41 and 42 are fixed to the element mounting region 21*r* of the first lead-defining region 21', which is surrounded by the second resin portion 32. Furthermore, by the wires 43*a*, 43*b*, 43*c* and 43*d*, the light-emitting elements 41 and 42 are electrically connected to the first lead-defining region 21' and second lead-defining region 22'. As necessary, the protection element 60 is disposed in the recess 11. In this example, one terminal of the protection element 60 is electrically and physically connected to the second lead-defining region 22' with solder or the like, and its other terminal is electrically connected to the first lead-defining region 21' via the wire 61.

Subsequently, the light-reflective member 50 is formed in the recess 11 of each light emitting device-defining region 101'. For example, the uncured resin material is introduced into the region between the inner side-wall surface of the recess 11 and the second resin portion 32 by a potting technique, thereafter is cured. The potting technique is a method that involves applying or dropping a resin material, and allowing the resin material to be placed in appropriate regions via flow of the resin material.

According to a method of producing a light emitting device of the present disclosure, the second resin portion 32 extends around the element mounting region 21*r*. As a result, even if the uncured resin material is moved within the recess 11, the flow of the resin material toward the center of the element mounting region 21*r* can be stopped by the second resin portion 32. As a result, the position of the inner edge of the uncured resin material can be determined by the second resin portion 32, whereby the uncured resin material to be the light-reflective member 50 can be appropriately placed on the bottom face 11*b* of the recess 11. As has been described with reference to FIG. 2C, herein, the resin connecting portion 34 has its upper face 34*a* at substantially the same height as the upper face 21*a* of the first lead 21, and thus the resin connecting portion 34 does not obstruct flow of the uncured resin material to be the light-reflective member 50.

Thereafter, the uncured resin material that has been introduced into the predetermined regions within the recess 11 is cured with heat, light, or the like. Furthermore, the recess created by the sloped surface 50*s* of the light-reflective member 50 is filled with the uncured resin material, so that at least the light-emitting elements 41 and 42 and the second resin portion 32 are covered. At this time, the uncured resin material is also placed inside the depressions 32*v* of the second resin portion 32. Thereafter, by curing the resin material that has been introduced in the recess created by the sloped surface 50*s*, the encapsulant 75 covering the light-emitting elements 41 and 42 and the second resin portion 32 is formed. Placing the uncured resin material inside the depressions 32*v* of the second resin portion 32, can realize the encapsulant 75, parts of which are located inside the depressions 32*v*. By forming the encapsulant 75, the collective substrate 201 including the plurality of light emitting devices 101 that are yet to be singulated, as shown in FIG. 7A, is completed.

(B) Step of Singulating Collective Substrate into Light Emitting Devices

Figure 12A:
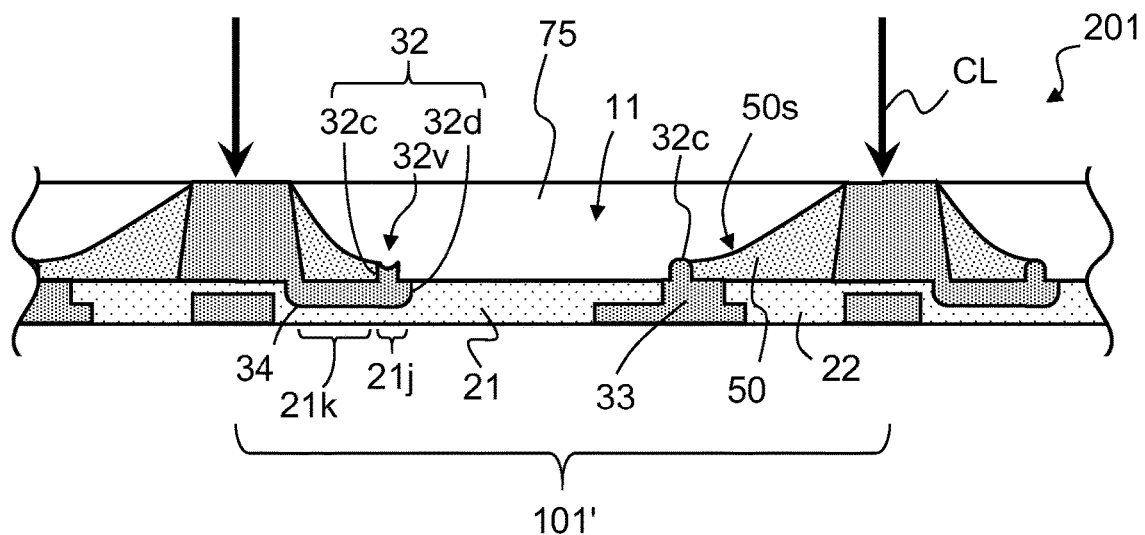
FIG. 12A is a cross-sectional view showing a production step of a light emitting device according to the first embodiment.
Figure 12B:
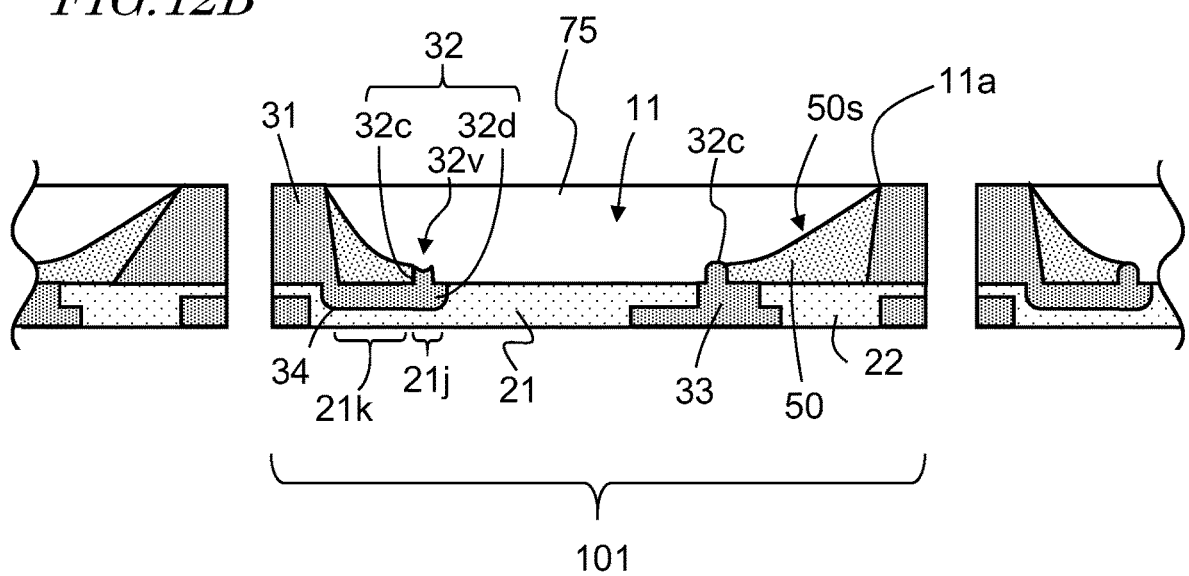
FIG. 12B is a cross-sectional view showing a production step of a light emitting device according to the first embodiment.

Subsequently, the collective substrate 201, including the plurality of light emitting device-defining regions 101' each including the light-reflective member 50 in the recess 11, is cut at predetermined positions. In this example, the collective substrate 201 is cut at positions indicated by bold arrows CL in FIG. 12A. By cutting the collective substrate 201, as shown in FIG. 12B, the collective substrate 201 is singulated into the plurality of light emitting devices 101.

Example methods of singulating the collective substrate 201 include various methods, such as using a lead-cutting mold, cutting with a dicing saw, or cutting with laser light. In the case in which the collective substrate 201 includes a plurality of resin packages 10 that are integrally molded, the lead frame 202 and the resin bodies 30 may also be cut concurrently during singulating the collective substrate 201. The plurality of resin packages 10 may be integrally molded, or individually molded. In the case in which the resin package 10 is individually molded for each light emitting device-defining region 101', they may be singulated by cutting the lead frame 202 at positions between every two adjacent resin packages 10.

Other than being produced through the aforementioned production steps, the collective substrate 201 may be obtained by purchasing a pre-fabricated collective substrate, etc. Other than a collective substrate including a plurality of resin packages 10 can be used, a single resin package 10 may be provided for use, for example.

Figure 13A:
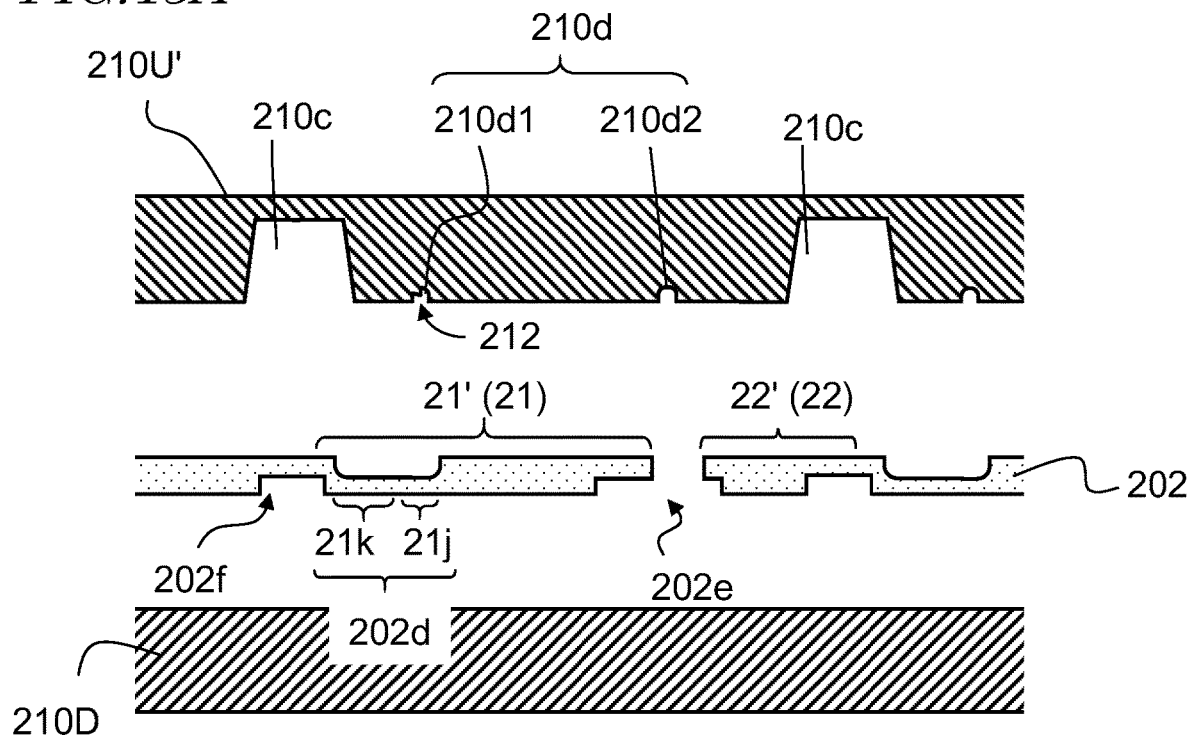
FIG. 13A is a step-by-step cross-sectional view showing a variant of the method of producing a light emitting device.
Figure 13B:
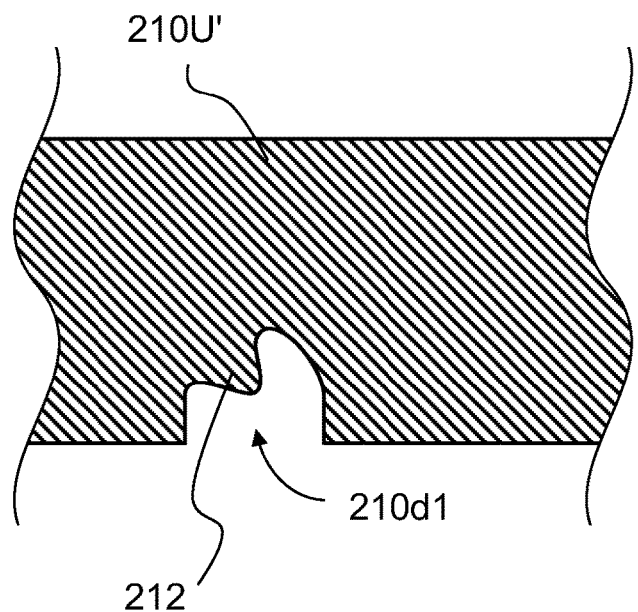
FIG. 13B is a schematic cross-sectional view showing enlargement of a protrusion shown in FIG. 13A and a vicinity thereof.
Figure 13C:
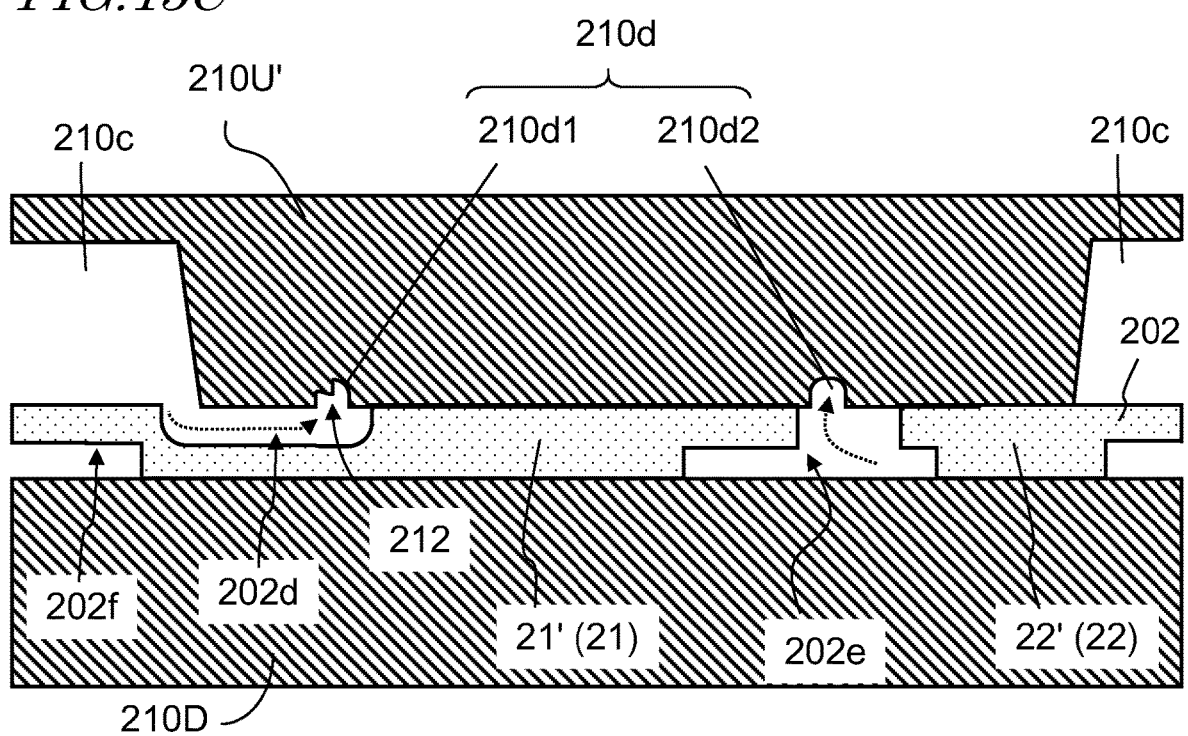
FIG. 13C is a diagram showing enlargement of a portion of FIG. 13A.

The method of forming the depressions 32v is not limited to aforementioned example. For example, as shown in FIGS. 13A through 13C, an upper die 210U' having one or more protrusions 212 protruding toward the inside of the second space 210d may be used. FIG. 13B shows enlargement of the protrusion 212 shown in FIG. 13A and the vicinity thereof, while FIG. 13C shows enlargement of a portion of FIG. 13A. By forming the one or more protrusions 212 on the upper die 210U' in advance, it is possible to form depressions of desired shapes at desired positions on the first subportion 32c. As in the example that has been described with reference to FIG. 9A and FIG. 9B, a release sheet 300 may be present between the upper die 210U' and the lead frame 202.

Alternatively, an upper die lacking the second space 210d may be used to form the resin-attached lead frame; uncured resin material may be applied to this resin-attached lead frame; and the resin material may be cured to form the first subportion 32c of the second resin portion 32.

Figure 14:
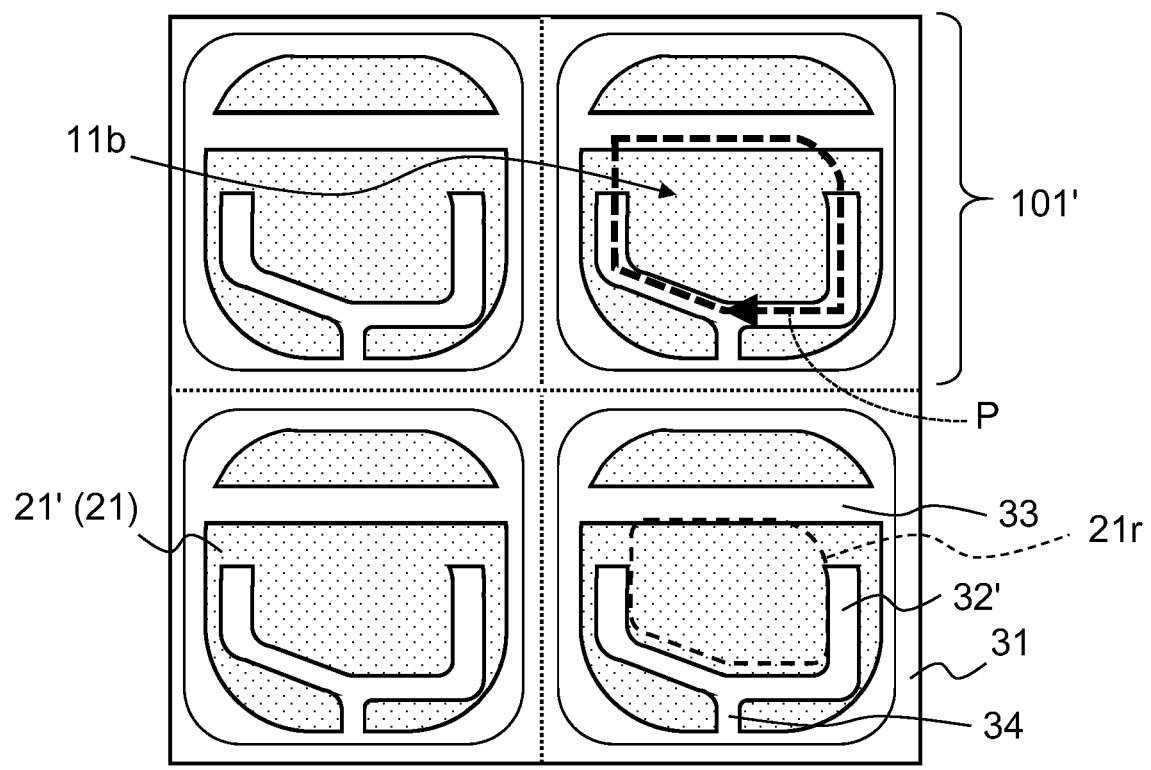
FIG. 14 is a schematic top view for describing another variant of the method of producing of a light emitting device.

FIG. 14 shows a part of the resin-attached lead frame that has been formed by using an upper die lacking the second space 210d. In the example shown in FIG. 14, the second resin portion 32' lacks a portion that protrudes from the upper face of the first lead-defining region 21'. After obtaining such a resin-attached lead frame, uncured resin material is linearly introduced onto the bottom face 11b of the recess 11 of each light emitting device-defining region 101' by using a dispenser or the like.

As is indicated by a broken-lined arrow P in FIG. 14, uncured resin material is introduced onto the bottom face 11b of the recess 11 while moving the nozzle of a dispenser along the shape of the element mounting region 21r, by beginning at the position of the resin connecting portion 34, for example. At this time, the amount of resin material to be dispensed from the nozzle and/or the speed of the nozzle movement may be altered so as to adjust the amount of the resin material to be introduced onto the bottom face 11b, thereby changing the height of the first subportion 32c obtained by curing the resin material. For example, if the nozzle is moved fast near the resin connecting portion 34, in the resulting structure after the curing, the height of the portion near the resin connecting portion 34 can be selectively made small. This can result in obtaining a resin-attached lead frame having a depression 32v in the first subportion 32c near such a portion near the resin connecting portion 34.

In accordance with the light emitting device 101, as one or more depressions 32v are provided in the surface of the second resin portion 32, the surface area of the second resin portion 32 can be increased. An increased surface area of the second resin portion 32 results in an increased contact area between the second resin portion 32 and the encapsulant 75, whereby the second resin portion 32 and the encapsulant 75 can be adhered more firmly. Due to improved adhesion of the encapsulant 75, the encapsulant 75 is less likely to delaminate from the recess 11, whereby reliability of the light emitting device 101 can be improved. This effect can also be obtained by providing a protrusion(s) instead of the depression(s) 32v.

A depression 32v can have a shape extending along a direction that intersects the direction that the second resin portion 32 extends, and at least a portion of the depression 32v can be located below a wire that electrically connects the light-emitting element to a lead. This can locally decrease the height of the first subportion 32c of the second resin portion 32 at the position of the depression 32v. This allows the wire to be disposed in the recess 11 more easily. By shaping the depression 32v so as to extend substantially in parallel to the direction that the second resin portion 32 extends, the effect of increasing the surface area of the second resin portion 32 can be provided, without impairing the function of stopping the uncured resin material.

Providing on the resin package 10 the resin connecting portion 34 that connects the first resin portion 31 and the second resin portion 32 to each other reduces the possibility that the second resin portion 32 may delaminate from the lead. That is, the second resin portion 32 can be placed on the bottom face 11b of the recess 11 more firmly. There may be a depression 32v that is located near a site in the second resin portion 32 where the second resin portion 32 and the resin connecting portion 34 are connected.

Moreover, by making a groove in a lead, and forming the second resin portion 32 so that a part of the second resin portion 32 is located inside the groove, adhesion between the lead and the second resin portion 32 can be improved. That is, the second resin portion 32 can be placed on the bottom face 11b more firmly.

Second Embodiment

Figure 15A:
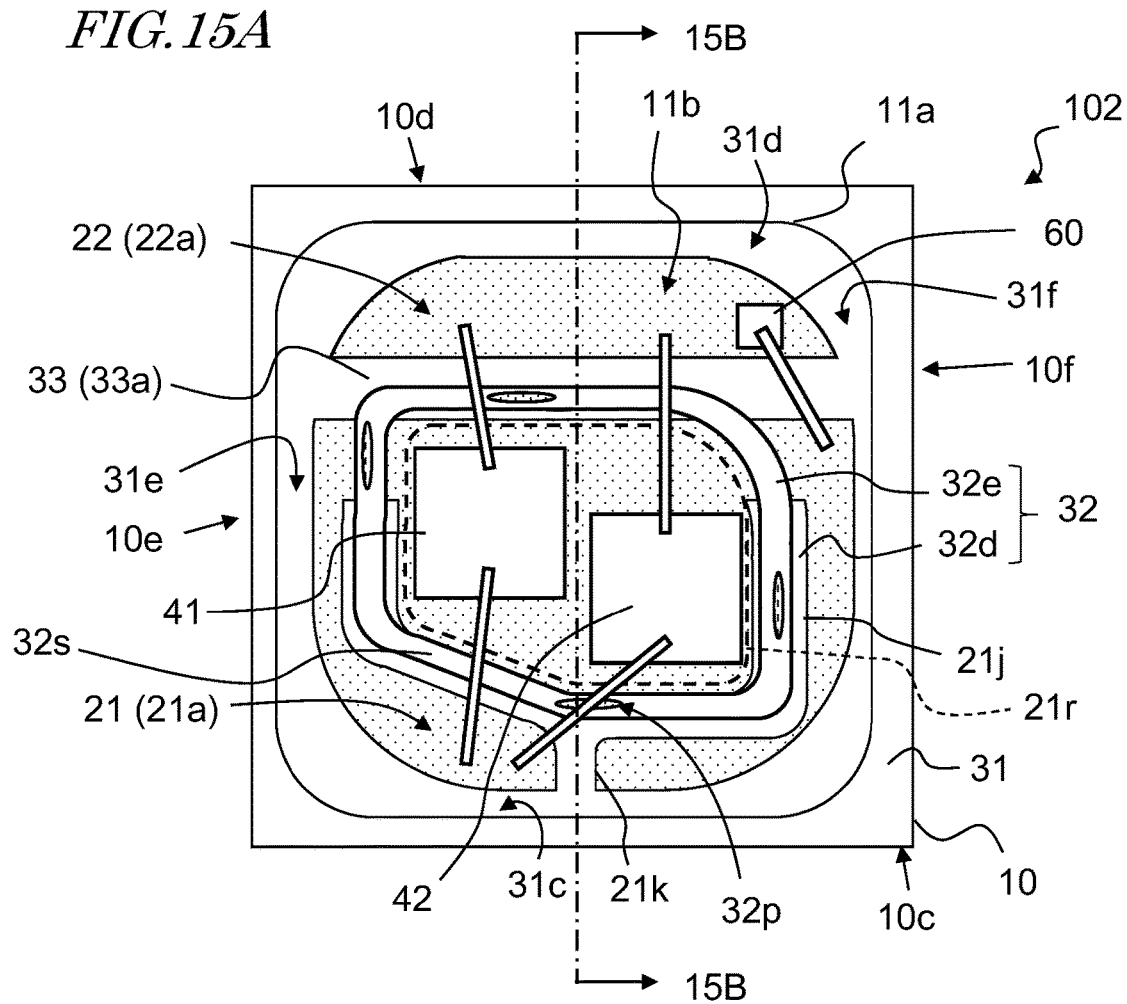
FIG. 15A is a schematic top view showing a structure excluding a light-reflective member and an encapsulant from a light emitting device according to a second embodiment.

FIG. 15A is a schematic top view excluding the light-reflective member 50 and the encapsulant 75 from the light emitting device 102 according to a second embodiment of the present disclosure. A main difference between the light emitting device 101 according to the first embodiment and the light emitting device 102 according to the second embodiment is that the second resin portion 32 of the light emitting device 102 has one or more protrusions 32p on its surface. Otherwise the light emitting device 102 may be similar in structure to the light emitting device 101. Therefore, differences from the light emitting device 101 will mainly be described below.

In the exemplary construction illustrated in FIG. 15A, as in the light emitting device 101 according to the first embodiment, the second resin portion 32 of the resin body 30 includes a first subportion 32e that is located above the plane including the upper face 21a of the first lead 21, and a second subportion 32d that is disposed in the first groove 21j of the first lead 21. The first subportion 32e includes one or more protrusions 32p that are shaped so as to protrude from its surface. In this example, four protrusions 32p are provided, one of which is located near a site at which the second resin portion 32 and the resin connecting portion 34 are connected.

Figure 15B:
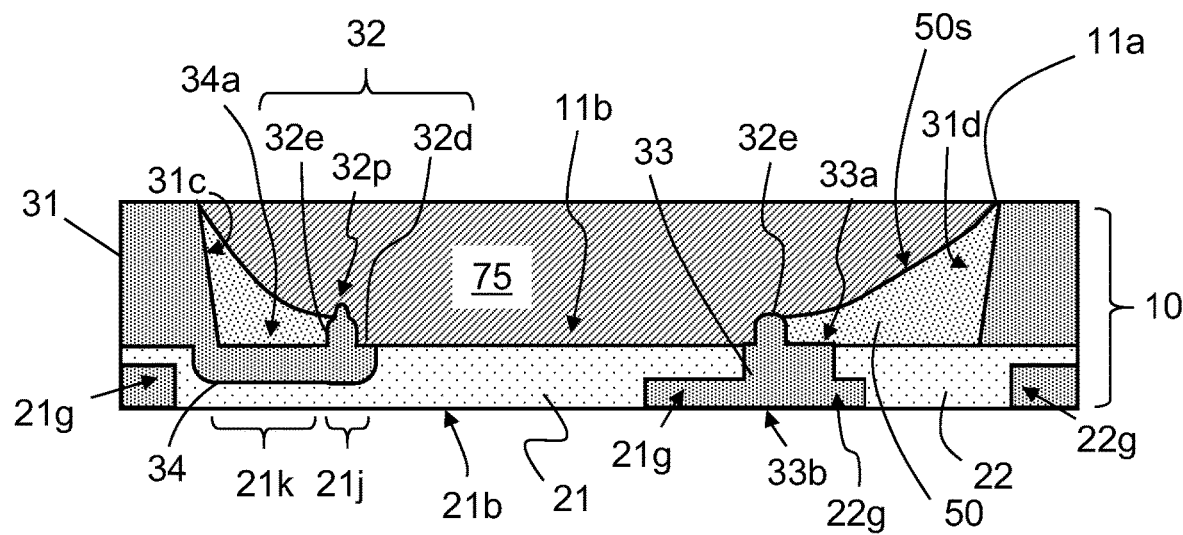
FIG. 15B is a schematic end view of the light emitting device 102 taken along line 15B-15B in FIG. 15A.
Figure 15C:
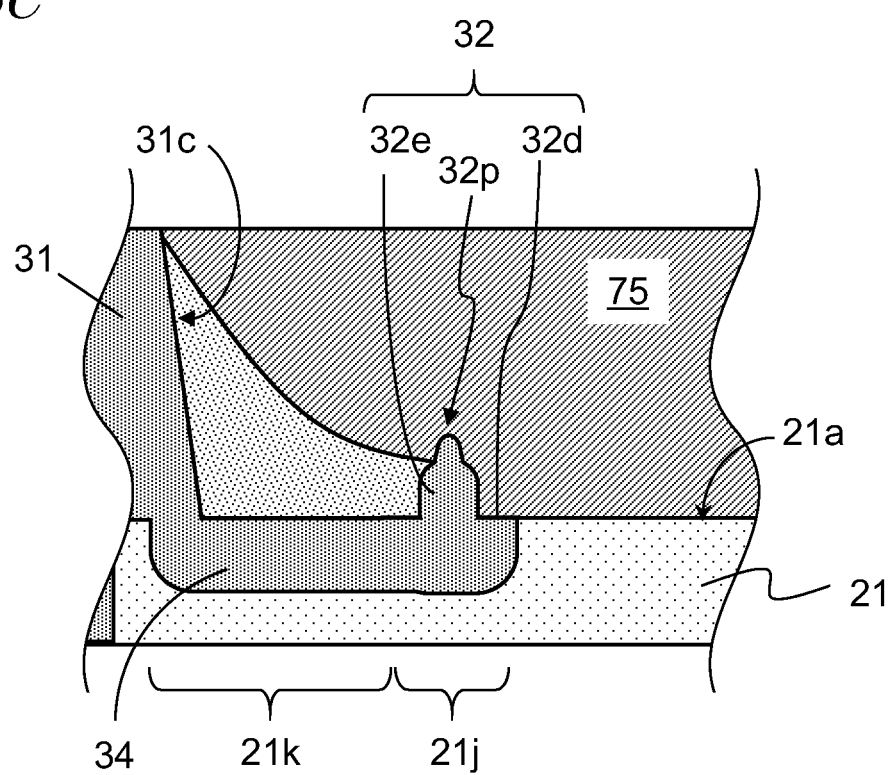
FIG. 15C is a schematic end view showing enlargement of a protrusion shown in FIG. 15B and a vicinity thereof.

FIG. 15B schematically shows an end face obtained by cutting the light emitting device 102 at a plane that is perpendicular to the lower face 10b of the resin package 10 at the position of line 15B-15B shown in FIG. 15A. FIG. 15C schematically shows enlargement of a protrusion 32p shown in FIG. 15B and the vicinity thereof. In FIG. 15B and FIG. 15C, a hatched portion represents the encapsulant 75, as in FIG. 2E and FIG. 2F.

As schematically shown in FIG. 15C, in the present embodiment, each protrusion 32p provided on the first subportion 32e is covered by the encapsulant 75. By providing the protrusions 32p on the second resin portion 32, the surface area of the second resin portion 32 can be increased, similarly to providing depressions 32v. Furthermore, by forming the encapsulant 75 so as to cover the protrusions 32p, the contact area between the second resin portion 32 and the encapsulant 75 can be increased as compared to the case in which the protrusions 32p are not provided, whereby firmer adhesion between the second resin portion 32 and the encapsulant 75 can be achieved. As a result, the encapsulant 75 is less likely to delaminate from the second resin portion 32, whereby reliability of the light emitting device 102 is improved. Protrusions and depressions may be mixedly present on the surface of the first subportion 32e.

See FIG. 15A again. As is the case with the aforementioned depressions 32v and 32v', the number, shapes, and positioning of protrusions 32p on the first subportion 32e of the second resin portion 32 may be appropriately selected. However, from the standpoint of restraining the lateral faces of the light-emitting elements 41 and 42 from becoming covered by the light-reflective member 50, it may be advantageous to form the protrusion(s) 32p at a position(s) in the first subportion 32e where its distance from the inner sidewall surface of the recess 11 is relatively small. This is because the second resin portion 32 has the function of stopping the uncured resin material to be the light-reflective member 50 at the position of the second resin portion 32. Moreover, it may be advantageous that each protrusion 32p is shaped so as to extend mainly along the direction that the second resin portion 32 extends, whereby the uncured resin material to be the light-reflective member 50 can be stopped more effectively at the position of the second resin portion 32.

In the example shown in FIG. 15A, as compared to the oblique section 32s of the first subportion 32e, the area where the second resin portion 32 and the resin connecting portion 34 are connected has a small distance from the inner side-wall surface of the recess 11. This means that, in the case in which the uncured resin material is dropped in the region between the inner side-wall surface of the recess 11 and the second resin portion 32, and the resin material is spread by flowing, the resin material is more likely to go over the first subportion 32e near the site at which the second resin portion 32 and the resin connecting portion 34 are connected, than at the position of the oblique section 32s. Therefore, as shown in FIG. 15A, by forming a protrusion 32p at a position of the first subportion 32e at which the distance from the inner side-wall surface of the recess 11 is relatively small, the height of the first subportion 32c can be partially increased, thereby alleviating the resin material from intruding into the region inside the first subportion 32e more effectively.

Method of Producing Light Emitting Device 102

As in the first embodiment, the light emitting device 102 can be obtained through step (A) of providing a collective substrate and step (B) of singulating the collective substrate into a plurality of light emitting devices. The steps after obtaining the collective substrate may be similar to those in the first embodiment, and the description of the concerning step (B) is omitted here.

(A) Step or Providing Collective Substrate

First, the resin-attached lead frame is produced. As in the first embodiment, the lead frame 202 is disposed between a die that includes an upper die and a lower die, then the resin material is poured into the spaces within the die and cured, in order to form the resin-attached lead frame, for example.

Figure 16A:
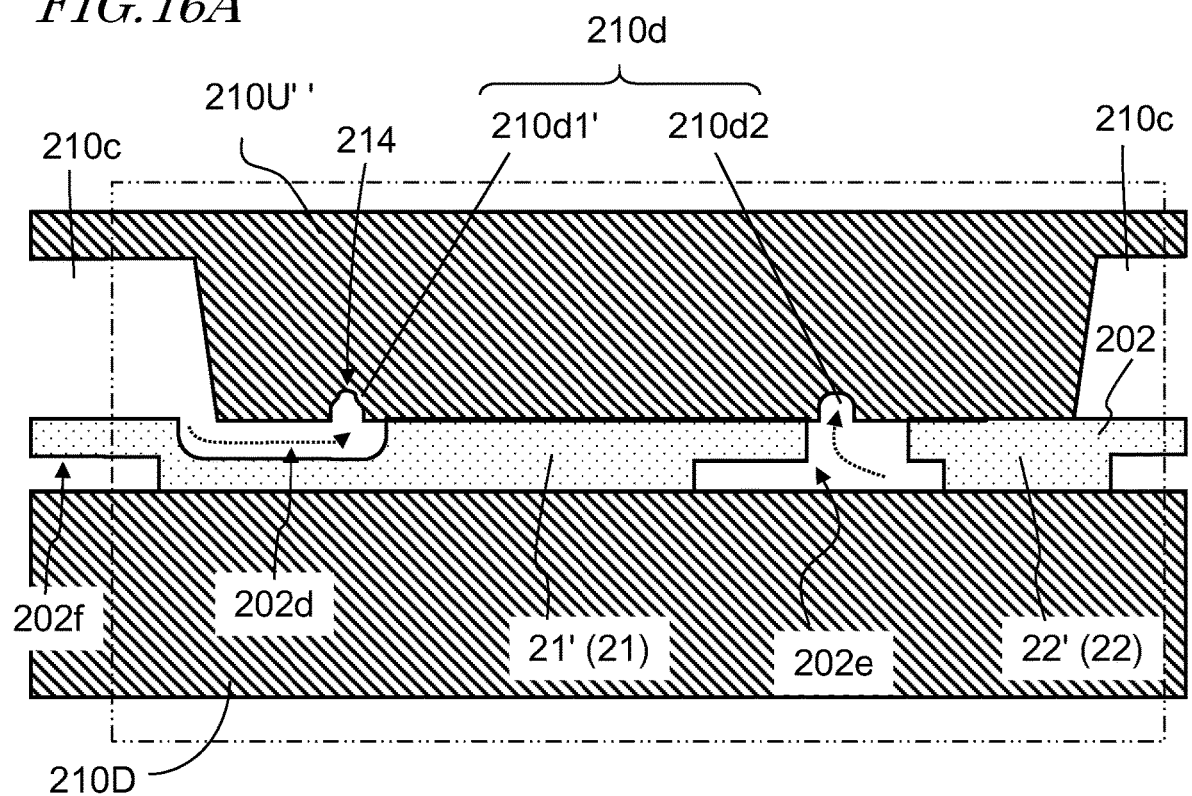
FIG. 16A is a cross-sectional view showing a production step of a light emitting device according to the second embodiment.

FIG. 16A shows the lead frame 202 being sandwiched between an upper die 210U" and a lower die 210D. In FIG. 16A, rectangle defined by a double-dot dashed lined indicates a portion corresponding to the cross section shown in FIG. 15B.

Figure 16B:
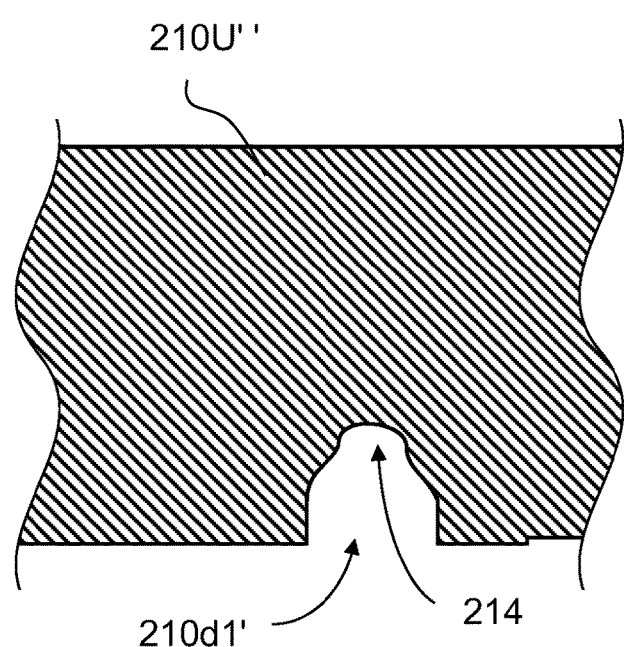
FIG. 16B is a schematic cross-sectional view showing enlargement of a recess shown in FIG. 16A and a vicinity thereof.

The upper die 210U" used herein has a second space 210d that includes a space 210d1' and a space 210d2. As shown in FIG. 16A, in the space 210d1', the upper die 210U" has a recess 214 that is concaved toward the inside of the upper die 210U". FIG. 16B shows enlargement of the recess 214 shown in FIG. 16A and the vicinity thereof. When uncured resin material to become the resin body 30 is introduced in the space within the die being sandwiched by the upper die 210U" and the lower die 210D, these spaces are filled with the uncured resin material. At this time, the inside of the recess 214 is also filled with the uncured resin material.

After introducing the uncured resin material, the resin material in the die is pre-cured by heating. Thereafter, the lead frame 202 to which the pre-cured resin material is attached is taken out of the die, and then a main cure of the resin material is performed at a higher temperature than in the pre-cure. As a result, a resin-attached lead frame is obtained. Curing the resin material placed inside the recess 214 of the upper die 210U" allows the aforementioned protrusions 32p to be formed. By adjusting the number, shapes, and positioning of recesses 214 in the upper die 210U", the protrusions 32p may be formed on the second resin portion 32 with the appropriately selected number, shapes, and positioning.

After the resin-attached lead frame is obtained, the light-emitting elements 41 and 42 and the like are placed on the resin-attached lead frame. Thereafter, using a potting technique, for example, uncured resin material is introduced in the region between the inner side-wall surface of the recess 11 and the second resin portion 32, and the resin material is cured. Similarly to the first embodiment, the position of the inner edge of the uncured resin material in the present embodiment can be determined by the second resin portion 32, whereby the uncured resin material to be the light-reflective member 50 can be appropriately placed in predetermined regions of the recess 11. The uncured resin material that has been introduced in the predetermined regions of the recess 11 is cured with heat, light, or the like, whereby the light-reflective member 50 can be formed.

Subsequently, the recess created by the sloped surface 50s of the light-reflective member 50 is filled with the uncured resin material, so that at least the light-emitting elements 41 and 42 and the second resin portion 32 are covered. At this time, the protrusions 32p on the second resin portion 32 can be covered with the uncured resin material. By curing the resin material that has been introduced in the recess created by the sloped surface 50s, the encapsulant 75 covering the light-emitting elements 41 and 42 and the second resin portion 32 is formed. By forming the encapsulant 75, the collective substrate including the plurality of light emitting devices 102 that are yet to be singulated is completed.

The method of forming the protrusions 32p can be appropriately selected other than foregoing example. For example, a resin-attached lead frame may be formed by using an upper die lacking the second space 210d; uncured resin material may be introduced in the resin-attached lead frame, and the resin material may be cured, whereby the first subportion 32e of the second resin portion 32 can be formed. By using the upper die lacking the second space 210d, a resin-attached lead frame that includes a second resin portion 32' that lacks a portion protruding from the upper face of the first lead-defining region 21' may be formed, and as indicated by a broken-lined arrow P in FIG. 14, the uncured resin material may be linearly introduced onto the bottom face 11b of the recess 11 of each light emitting device-defining region 101', by using a dispenser or the like.

For example, the uncured resin material is introduced onto the bottom face 11b of the recess 11 while moving the nozzle of a dispenser along the shape of the element mounting region 21r, by using the position of the resin connecting portion 34 as the starting point. At this time, the speed of nozzle movement may be decreased near the resin connecting portion 34, or more resin material may be introduced near the resin connecting portion 34, whereby, for example, the height of the resin connecting portion 34 and its vicinity can be selectively made large in the resulting structure after the curing. As a result of this, a resin-attached lead frame that includes a first subportion 32e having a protrusion 32p the resin connecting portion 34 and its vicinity can be obtained.

Alternatively, a release sheet having an aperture intentionally made in a part thereof may be allowed to be present between the upper die and the lead frame 202. For example, for a release sheet that is placed on the upper die, an aperture may be made in a portion of the release sheet that corresponds to the space to be filled with a resin material for forming the second resin portion 32, whereby a part of the resin material can be introduced in the space enters into the aperture of the release sheet. By pre-curing the resin material in this state, the surface of the second resin portion 32 can be created to protrude at the position of the aperture in the release sheet. After obtaining such a structure, a main cure of the resin material may be performed, whereby a second resin portion 32 including a first subportion 32e having a protrusion 32p on its surface can be formed.

The aforementioned depressions 32v and 32v' and protrusions 32p may be provided on the second subportion 32d of the second resin portion 32. Depressions 32v, 32v' or protrusions 32p may be provided on the second subportion 32d instead of or in addition to the first subportion 32c, whereby an effect of increasing the surface area of the second resin portion 32 can also be obtained. Therefore, similarly to the case of providing depressions 32v, 32v' or protrusions 32p on the first subportions 32c or 32e of the second resin portion 32, adhesion of the encapsulant 75 with respect to the second resin portion 32 can be improved, and delamination of encapsulant 75 from the bottom face 11b of the recess 11 can be alleviated.

While embodiments of the present invention have been described, it will be apparent to those skilled in the art that the disclosure may be modified in numerous ways and may assume many embodiments other than those specifically described above. Accordingly, it is intended by the appended claims to cover all modifications of the invention that fall within the true spirit and scope of the invention.

What is claimed is:

1. A light emitting device comprising:
a light-emitting element;
a resin package comprising:
    a plurality of leads including a first lead and a second lead,
    a first resin portion defining an outer lateral face of the resin package,
    a second resin portion extending around an element mounting region in which the light emitting element is disposed, and
    a third resin portion located between the first lead and the second lead,
    wherein the plurality of leads and the first resin portion define a recess having an inner side-wall surface, and
    wherein upper faces of the plurality of leads are partly located at a bottom of the recess;
a light-reflective member located between the inner side-wall surface and the second resin portion inside the recess; and
an encapsulant located in a region of the recess that is surrounded by the light-reflective member, the encapsulant covering the second resin portion and the light-emitting element;
wherein the first lead has a first groove in the upper face located at the bottom of the recess, the first groove extending at least partly around the element mounting region;
wherein at least a part of the second resin portion is disposed in the first groove;
wherein the second resin portion has a depression in a surface thereof; and
wherein a part of the encapsulant is located inside the depression of the second resin portion.

2. The light emitting device of claim 1, wherein the depression extends along a direction that intersects a direction in which the second resin portion extends.

3. The light emitting device of claim 2, further comprising:
a wire electrically connecting the light-emitting element and a part of the plurality of leads that is located outside the element mounting region;
wherein a part of the wire is located above the depression of the second resin portion.

4. The light emitting device of claim 1, wherein the resin package comprises a resin connecting portion that is located at the bottom of the recess and connects the first resin portion and the second resin portion.

5. The light emitting device of claim 4, wherein the depression is located proximate a site at which the resin connecting portion and the second resin portion are connected.

6. A light emitting device comprising:
a light-emitting element;
a resin package comprising:
    a plurality of leads including a first lead and a second lead,
    a first resin portion defining an outer lateral face of the resin package,
    a second resin portion extending around an element mounting portion in which the light-emitting element is disposed, and
    a third resin portion located between the first lead and the second lead,
    wherein the plurality of leads and the first resin portion define a recess having an inner side-wall surface, and wherein upper faces of the plurality of leads are partly located at a bottom of the recess;
a light-reflective member located between the inner sidewall surface and the second resin portion inside the recess; and
an encapsulant located in a region of the recess that is surrounded by the light-reflective member, the encapsulant covering the second resin portion and the light-emitting element;
wherein the first lead has a first groove in the upper face located at the bottom of the recess, the first groove extending at least partly around the element mounting region;
wherein at least a part of the second resin portion is disposed in the first groove;
wherein the second resin portion has a protrusion at a surface thereof; and
wherein the protrusion is covered by the encapsulant.

7. The light emitting device of claim 6, wherein the resin package comprises a resin connecting portion that is located at the bottom of the recess and connects the first resin portion and the second resin portion.

8. The light emitting device of claim 7, wherein the protrusion is located proximate a site at which the resin connecting portion and the second resin portion are connected.

9. The light emitting device of claim 2, wherein the resin package comprises a resin connecting portion that is located at the bottom of the recess and connects the first resin portion and the second resin portion.

10. The light emitting device of claim 9, further comprising:
a wire electrically connecting the light-emitting element and a part of the plurality of leads that is located outside the element mounting region;
wherein the depression is located proximate a site at which the resin connecting portion and the second resin portion are connected; and
wherein a part of the wire is located above the depression of the second resin portion.

11. The light emitting device of claim 1, wherein the light-reflective member is separated from the light-emitting element.

12. The light emitting device of claim 1, further comprising a protection element disposed on the upper face of the second lead.

13. The light emitting device of claim 12, wherein the protection element is embedded in the light-reflective member.

14. The light emitting device of claim 1, wherein the second resin portion comprises a first section extending along a first direction parallel to the outer lateral face of the resin package in a top view.

15. The light emitting device of claim 14, wherein the second resin portion further comprises a second section extending along a second direction perpendicular to the first direction in a top view.

16. The light emitting device of claim 15, wherein the second resin portion further comprises a circular arc section that connects between the first section and the second section in a top view.

17. The light emitting device of claim 13, wherein:
the second resin portion comprises:
a first section extending along a first direction parallel to the outer lateral face of the resin package in a top view,
a second section extending along a second direction perpendicular to the first direction in a top view, and
a circular arc section that connects between the first section and the second section in a top view.

18. The light emitting device of claim 17, wherein the light-reflective member is separated from the light-emitting element.

19. The light emitting device of claim 2, further comprising:
a protection element disposed on the upper face of the second lead, the protection element embedded in the light-reflective member;
wherein the light-reflective member is separated from the light-emitting element; and
wherein the second resin portion comprises a first section extending along a first direction parallel to the outer lateral face of the resin package in a top view.

20. The light emitting device of claim 4, further comprising:
a protection element disposed on the upper face of the second lead, the protection element embedded in the light-reflective member;
wherein the light-reflective member is separated from the light-emitting element; and
wherein the second resin portion comprises a first section extending along a first direction parallel to the outer lateral face of the resin package in a top view.

* * * * *